(12) United States Patent
Asai et al.

(10) Patent No.: US 7,546,678 B2
(45) Date of Patent: Jun. 16, 2009

(54) ELECTRONIC COMPONENT MOUNTING APPARATUS

(75) Inventors: Jun Asai, Ota (JP); Akira Aoki, Ashikaga (JP); Shigeru Kuribara, Ota (JP); Akihiro Kawai, Isesaki (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 365 days.

(21) Appl. No.: 10/952,571

(22) Filed: Sep. 29, 2004

(65) Prior Publication Data

US 2005/0102826 A1    May 19, 2005

(30) Foreign Application Priority Data

Sep. 30, 2003    (JP)    ............................. 2003-340183

(51) Int. Cl.
  *B23P 13/04*    (2006.01)
(52) U.S. Cl. ............................. 29/743; 29/739; 29/740; 29/741; 29/742; 29/720; 414/737; 414/751.1; 414/751.2; 901/40; 700/79
(58) Field of Classification Search .................. 29/743, 29/740, 832–834, 742, 709, 739; 382/151, 382/147; 228/102, 6.2, 105; 294/64.2; 901/40; 414/737, 751.1, 751.2; 700/89
  See application file for complete search history.

(56) References Cited

U.S. PATENT DOCUMENTS 5,003,692 A    4/1991    Izumi et al.
5,383,270 A *  1/1995    Iwatsuka et al. ............... 29/840
5,566,447 A *  10/1996   Sakurai ........................ 29/832
5,667,129 A *  9/1997    Morita et al. ................ 228/102

(Continued)

FOREIGN PATENT DOCUMENTS

EP    1 248 509 A1    10/2002

(Continued)

OTHER PUBLICATIONS

European Search Report, dated Mar. 5, 2009, directed to corresponding European Patent Application No. 04023337.1; 3 pages.

*Primary Examiner*—David P Bryant
*Assistant Examiner*—Tai Nguyen
(74) *Attorney, Agent, or Firm*—Morrison & Foerster LLP

(57) ABSTRACT

This invention provides an electronic component mounting apparatus which can detects an electronic component held by a suction nozzle without fail after a mounting operation of electronic components on a printed board and perform various processes in a case where the electronic component is held by the suction nozzle. The electronic component mounting apparatus has a line sensor unit for detecting presence or absence and a posture of an electronic component, a component recognition camera for recognizing a position of the electronic component held by suction by the suction nozzle, and a CPU for controlling the suction nozzle to discharge the electronic component in an exhaust box and controlling to skip this suction nozzle in a case where the line sensor unit does not detect the electronic component held by the suction nozzle when the line sensor unit performs detection whether or not the electronic component is held by the suction nozzle after a mounting operation of the electronic component held by the suction nozzle on a printed board, but in a case where the component recognition camera detects the electronic component held by the suction nozzle.

6 Claims, 21 Drawing Sheets

U.S. PATENT DOCUMENTS

| | | | | |
|---|---|---|---|---|
| 5,686,994 A * | 11/1997 | Tokura | ........................ | 356/394 |
| 5,864,944 A * | 2/1999 | Kashiwagi et al. | ............. | 29/833 |
| 5,907,644 A * | 5/1999 | Yokota et al. | ................ | 382/312 |
| 6,081,338 A * | 6/2000 | Reimann et al. | ............. | 356/634 |
| 6,088,911 A * | 7/2000 | Isogai et al. | ................... | 29/740 |
| 6,161,277 A * | 12/2000 | Asai et al. | ...................... | 29/740 |
| 6,178,626 B1 * | 1/2001 | Hada et al. | ..................... | 29/833 |
| 6,211,958 B1 * | 4/2001 | Hachiya et al. | .............. | 382/151 |
| 6,230,398 B1 * | 5/2001 | Murata et al. | ................... | 29/832 |
| 6,342,916 B1 * | 1/2002 | Kashiwagi et al. | ............. | 348/87 |
| 6,446,333 B1 * | 9/2002 | Kashiwagi et al. | ............. | 29/833 |
| 6,473,188 B1 * | 10/2002 | Kim | ........................... | 356/621 |

FOREIGN PATENT DOCUMENTS

| | | |
|---|---|---|
| JP | 2001-156498 | 6/2001 |
| JP | 2003-332791 | * 11/2003 |

* cited by examiner

ELECTRONIC COMPONENT MOUNTING APPARATUS

CROSS-REFERENCE OF THE INVENTION

This invention is based on Japanese Patent Application No. 2003-3401834, the content of which is incorporated by reference in its entirety.

BACKGROUND OF THE INVENTION

1. Field of the Invention

The invention relates an electronic component mounting apparatus having a plurality of component feeding units for feeding electronic components to component pickup positions, where the electronic components are picked up by suction from the predetermined component feeding units and mounted on a printed board by the suction nozzles.

2. Description of the Related Art

An electronic component automatic mounting apparatus of this type is described, for example, in Japanese Patent Application Publication No. 2001-156498, and so on. Chip components for mounting by the electronic component automatic mounting apparatus are getting smaller.

However, there sometimes arises such a problem that especially small electronic components cannot be mounted even after a mounting operation of electronic components on a printed board. Insufficient tack of solder paste, magnetization of a suction nozzle, and suction of a chip component in a suction hole of the suction nozzle can cause this problem.

SUMMARY OF THE INVENTION

This invention provides an electronic component mounting apparatus that can detect an electronic component held by a suction nozzle after a mounting operation of electronic components on a printed board and can perform various processes in a case where the electronic component is held by the suction nozzle.

An electronic component mounting apparatus of the invention has: a plurality of component feeding units for feeding electronic components to component pick-up positions; a suction nozzle for picking up the electronic component by suction from one of the plurality of the component feeding units and mounting the electronic component on a printed board; a line sensor unit for detecting presence or absence and a posture of the electronic component held by suction by the suction nozzle; a component recognition camera for recognizing a position of the electronic component held by suction by the suction nozzle; and a selection device for selecting from the line sensor unit only, the component recognition camera only, and both the line sensor unit and the component recognition camera, to detect the electronic component held by the suction nozzle after a mounting operation of electronic components held by suction by the suction nozzle on the printed board.

Furthermore, an electronic component mounting apparatus of the invention has: a plurality of component feeding units for feeding electronic components to component pick-up positions; a suction nozzle for picking up the electronic component by suction from one of the plurality of the component feeding units and mounting the electronic component on a printed board; a line sensor unit for detecting presence or absence and a posture of the electronic component held by suction by the suction nozzle; a component recognition camera for recognizing a position of the electronic component held by suction by the suction nozzle; and a control device for controlling to detect the electronic component held by the suction nozzle by the component recognition camera in a case where the line sensor unit does not detect the electronic component held by the suction nozzle first after a mounting operation of the electronic component held by suction by the suction nozzle on the printed board.

DETAILED DESCRIPTION OF THE INVENTION

Figure 1:
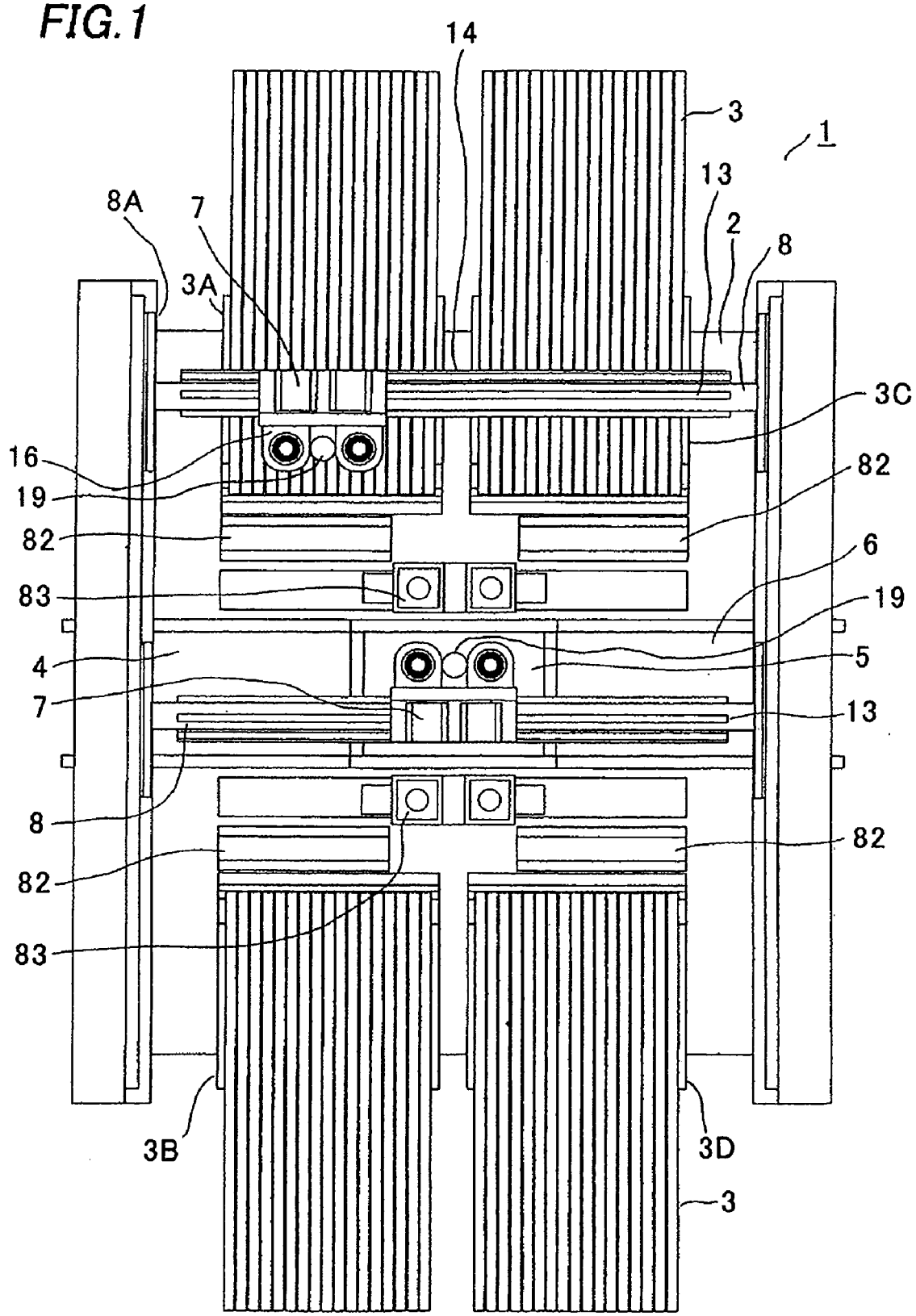
FIG. 1 is a plan view of an electronic component mounting apparatus of an embodiment of the invention.
Figure 2:
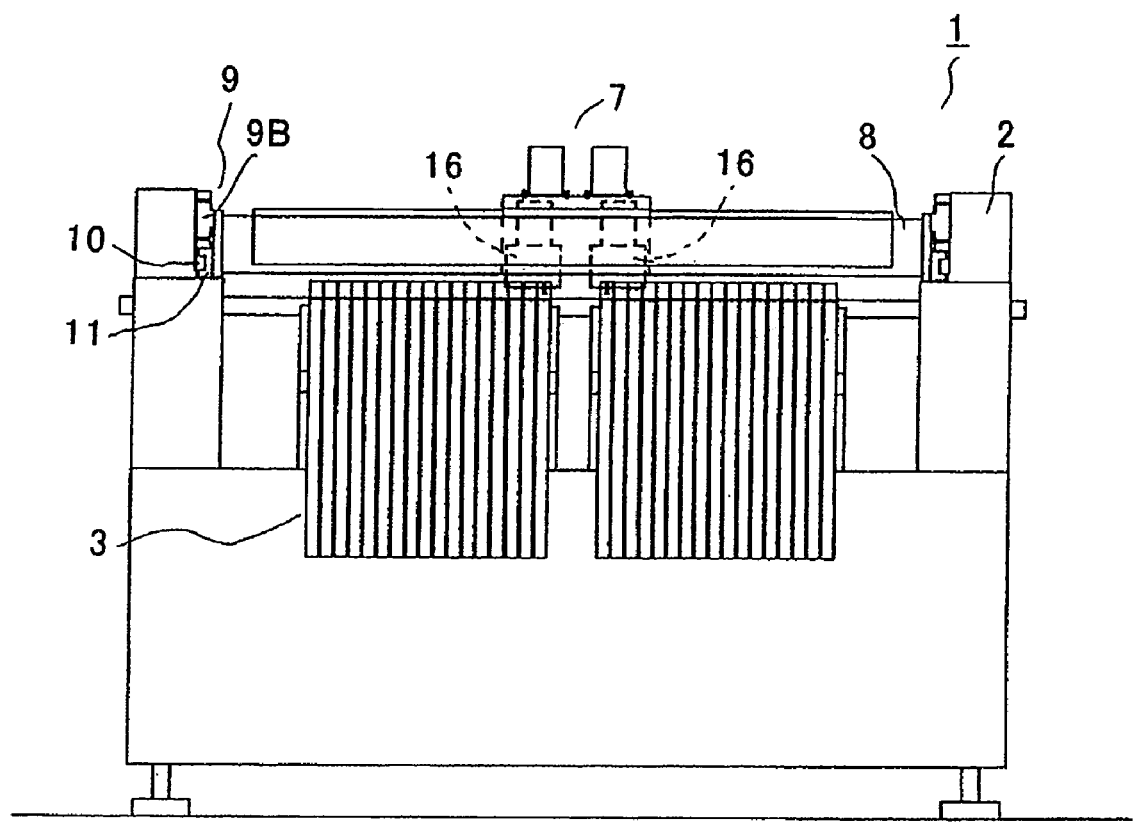
FIG. 2 is a front view of the electronic component mounting apparatus of FIG. 1.
Figure 3:
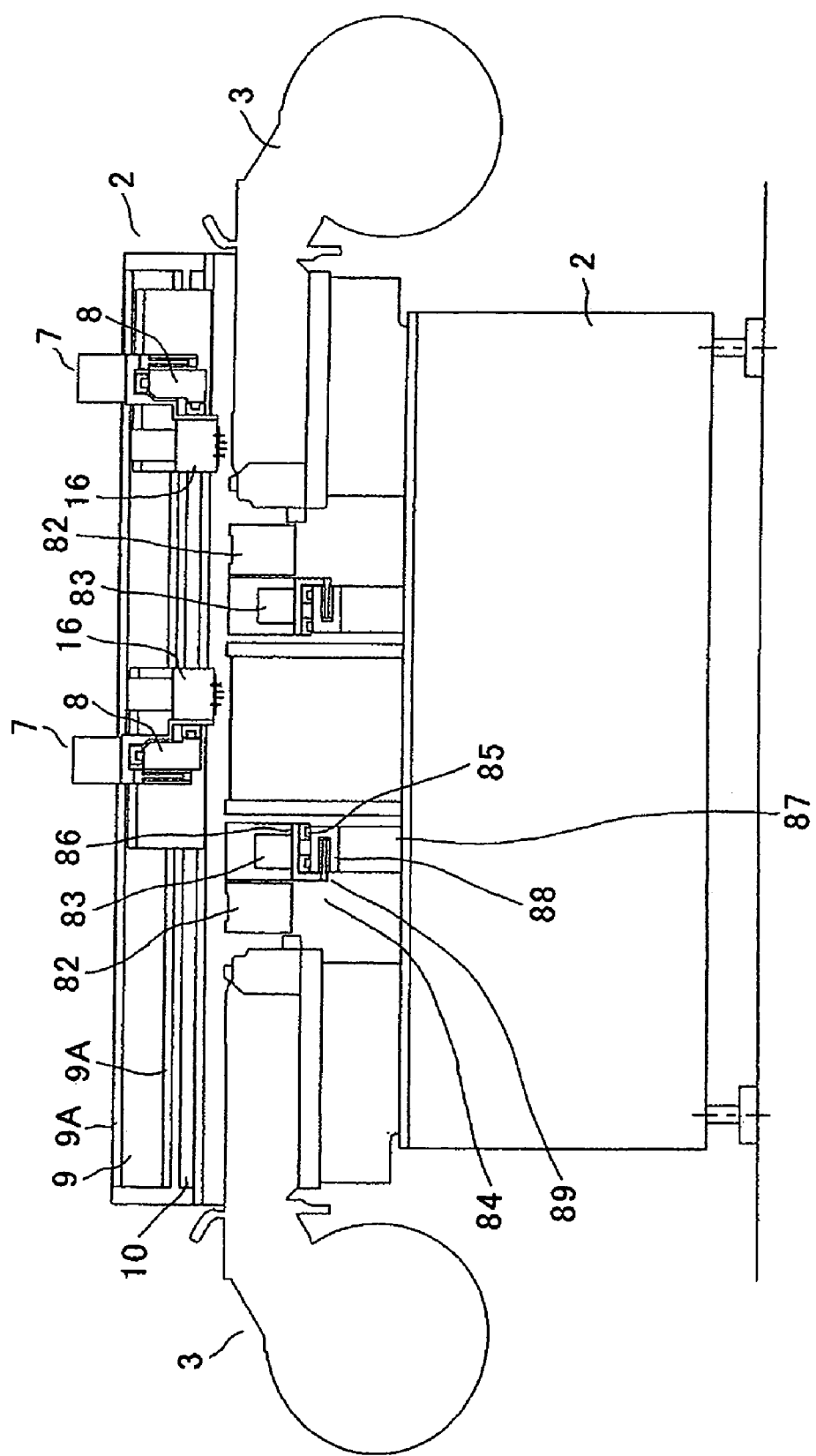
FIG. 3 is a right side view of the electronic component mounting apparatus of FIG. 1.

An embodiment of an electronic component mounting apparatus of the invention will be described with reference to the drawings. FIG. 1 is a plan view of an electronic component mounting apparatus 1, FIG. 2 is a front view of the electronic component mounting apparatus 1, and FIG. 3 is a right side view of the electronic component mounting apparatus 1. A plurality of component feeding units 3 for feeding a variety of electronic components one by one to each of component feeding positions (component pick-up positions) is attachably and detachably aligned and fixed on feeder bases 3A, 3B, 3C, and 3D on a base 2 in the apparatus 1. A feed conveyer 4, a positioning portion 5, and a discharge conveyer 6 are provided between groups of the units 3 facing to each other. The feed conveyer 4 conveys a printed board P received from an upstream to the positioning portion 5, an electronic component is mounted on the printed board P positioned by a positioning device (not shown) in the positioning portion 5, and the printed board P is conveyed to the discharge conveyer 6.

A numeral 8 designates a pair of beams extending in an X direction. Each of the beams 8 respectively moves in a Y direction above the printed board P on the positioning portion 5 or the component feeding positions (component pick-up positions) of the component feeding units 3 as sliders 11 fixed to each of the beams 8 slide along a pair of left and right guides 10, driven by each of linear motors 9. Each of the linear motors 9 has a pair of upper and lower stationary members 9A fixed on the base 2 and a moving member 9B fixed to a lower part of an attachment board 8A provided on each end of the beam 8.

Each of the beams 8 is provided with a mounting head body 7 which moves in a longitudinal direction, i.e., in the X direction along guides 13 driven by the linear motor 14. The linear motor 14 has a pair of front and back stationary members 14A fixed to the beam 8 and a moving member 14B provided on the mounting head body 7. Each of the mounting head bodies 7 has two mounting heads 16 each having twelve suction nozzles 15 each fixed to and pulled up by each of twelve springs 12. A board recognition camera 19 is provided between the mounting heads 16 in each of the mounting head bodies 7 and takes an image of a positioning mark (not shown) on the printed board P positioned on the positioning portion 5.

Figure 5:
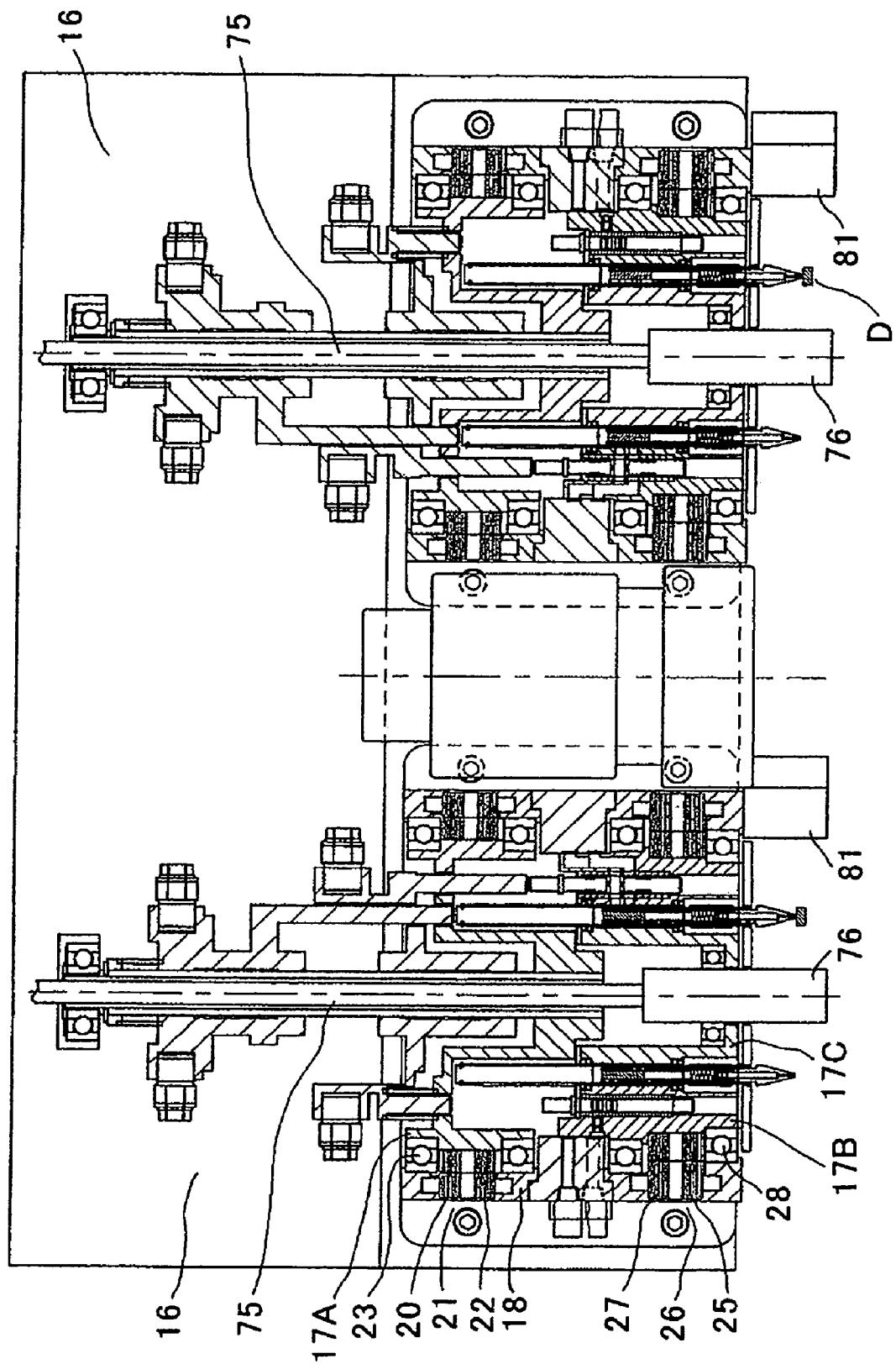
FIG. 5 is a view of a front longitudinal section of a mounting head body of the embodiment.
Figure 6:
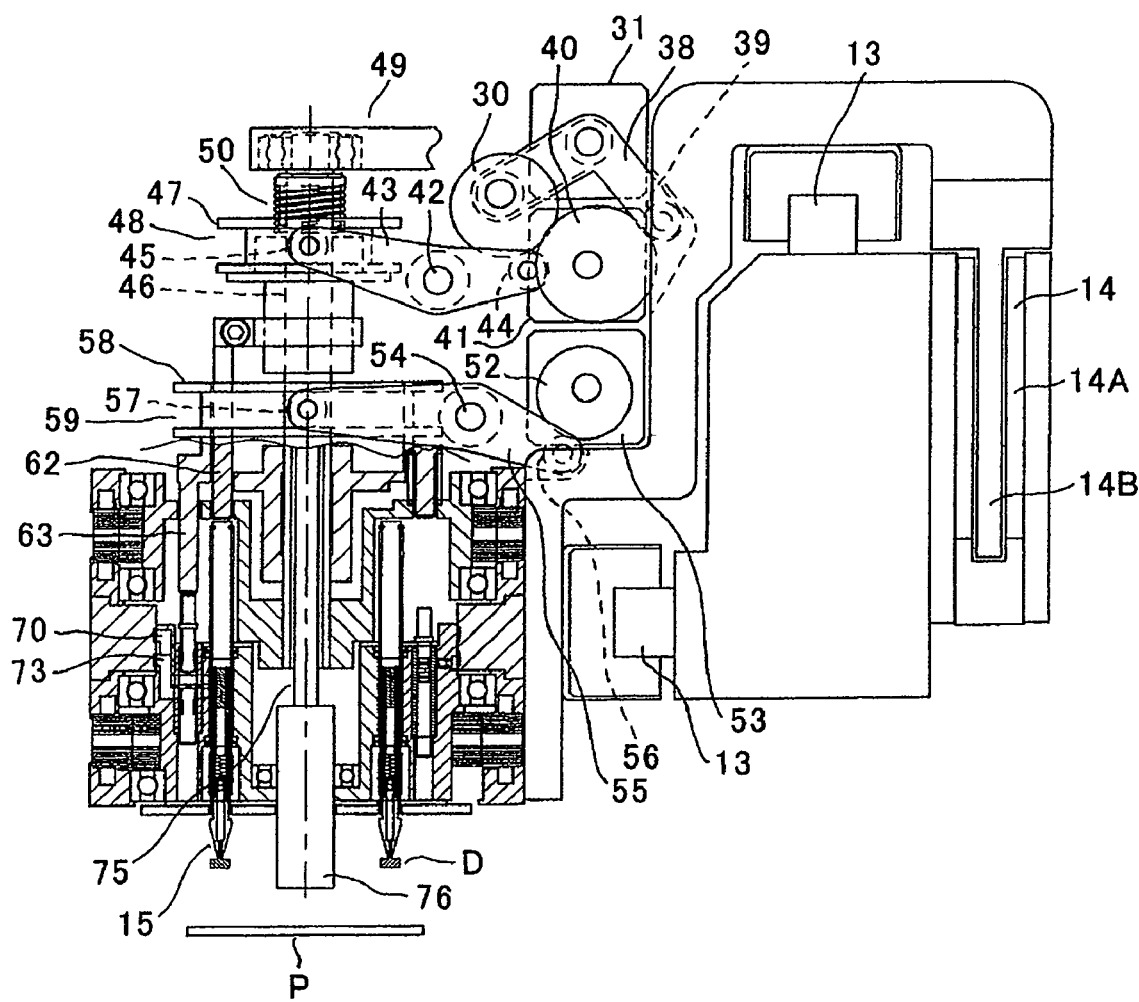
FIG. 6 is a view of a side longitudinal section of the mounting head body of the embodiment holding a thin electronic component by suction.

The mounting head 16 will be described with reference to FIGS. 5 and 6. A numeral 20 designates a rotor of a pulse motor 21 which is provided in an upper part of a first inner cylinder 17A and rotatable in a θ direction being contact with bearings 23 inside a stator 22 provided in an outer cylinder 18 fixed to the mounting head body 7. A numeral 25 designates a rotor of a pulse motor 26 which is provided in a lower part of a second inner cylinder 17B and rotatable in a θ direction being contact with bearings 28 inside a stator 27 provided in the outer cylinder 18 fixed to the mounting head body 7. Twelve suction nozzles 15 are provided on a circumference of a circle at predetermined intervals inside the second inner cylinder 17B, being movable upward and downward.

Figure 10:
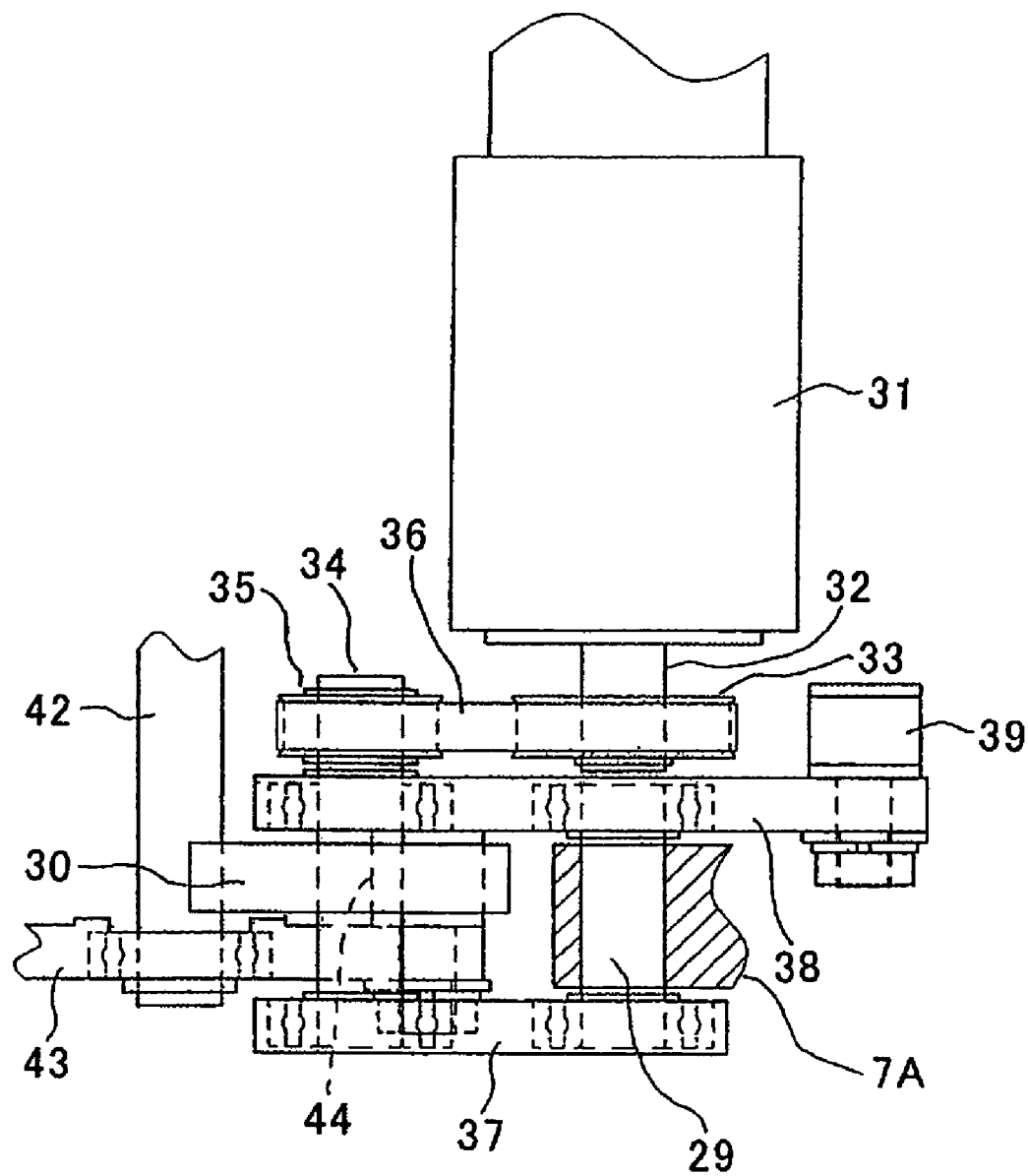
FIG. 10 is a plan view of a first cam, a first lever, and so front side on of the embodiment.
Figure 11:
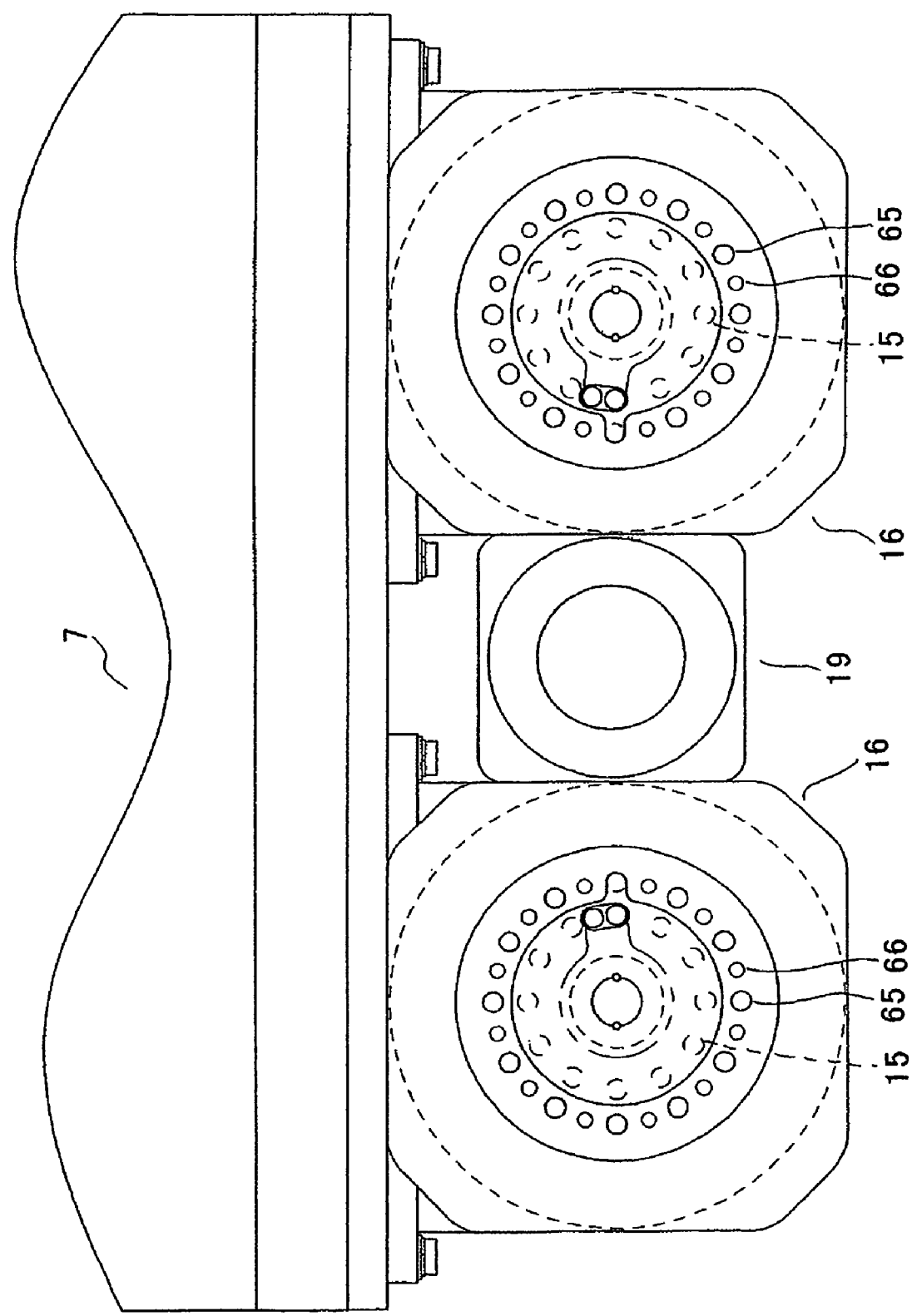
FIG. 11 is a plan view of the mounting head body of the embodiment.
Figure 12:
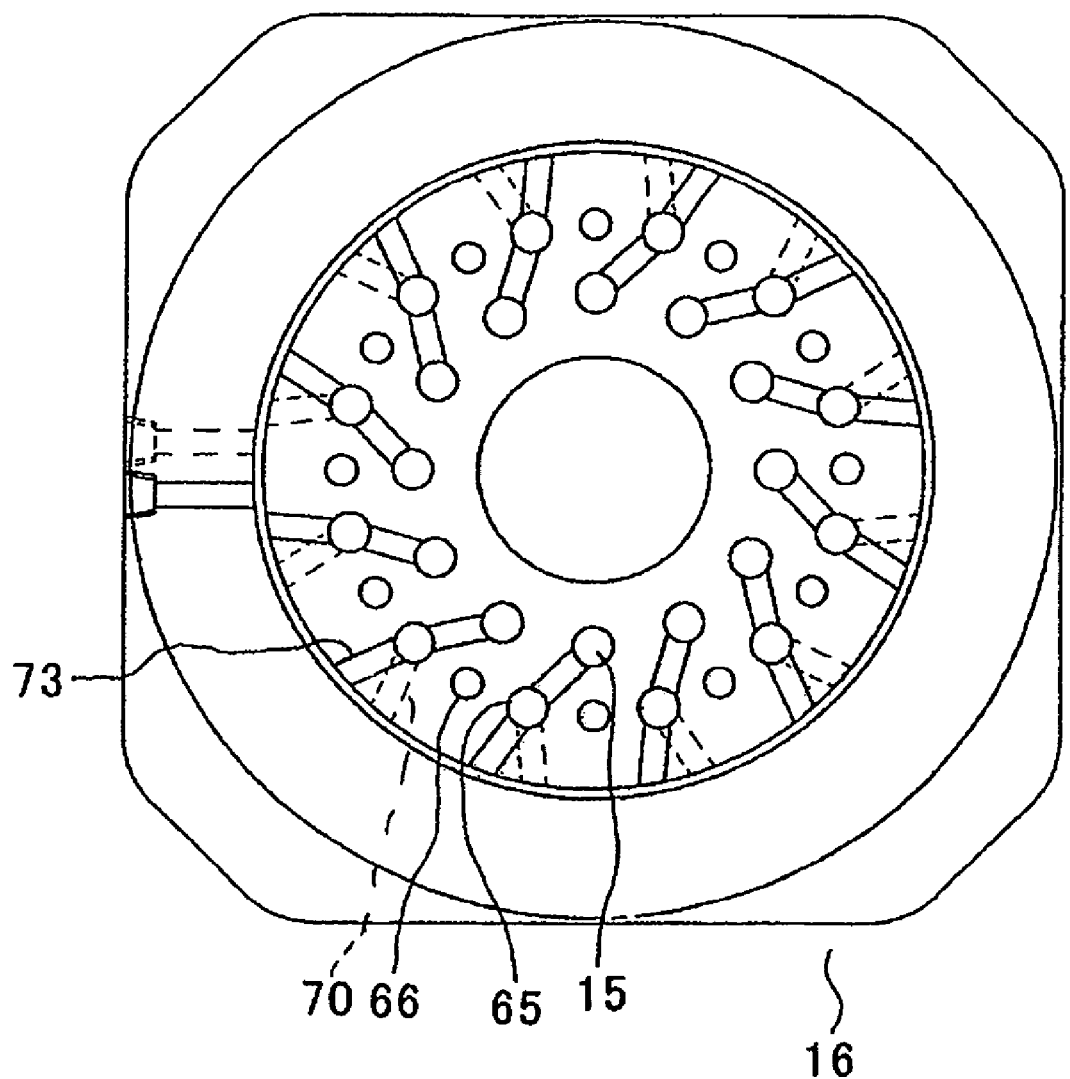
FIG. 12 is a simple plan view for explaining a vacuum or air blow state of the embodiment when an electronic component is held by suction or mounted by a suction nozzle.

A numeral 30 designates a first cam which makes a basic up-and-down stroke of the suction nozzles 15. The first cam 30 which is fixed to a follower axis 34 rotates by a belt 36 stretched between a pulley 33 provided on a driving axis 32 and a pulley 35 provided on the follower axis 34, driven by a drive motor 31 (FIG. 10). A cam follower 39 is provided on one side of a first lever 38 which is rotatable around a support axis 29 supported by a support portion 7A extending from the mounting head body 7. The support axis 29 and the follower axis 34 are connected with a connecting lever 37.

A numeral 40 designates a second cam which rotates driven by a drive motor 41 and makes an aligned up-and-down stroke of the suction nozzles 15 corresponding to a thickness of an electronic component. The cam follower 39 is pressed into contact with a circumference of the second cam 40. A cam follower 44 is provided on one end of the second lever 43 which turns around a support axis 42, and is pressed into contact with a circumference of the first cam 30. A cam follower 45 is provided on another end of the second lever 43, and engaged with a cam engagement portion 48 of a vertical shift body 47 which is movable upward and downward along a strut 46 which is a center of θ rotation of the mounting head 16. A spring 50 is interposed between the vertical shift body 47 and a support body 49, and pressurizes the vertical shift body 47 downward.

A numeral 52 designates a third cam for switching a vacuum valve, which rotates driven by the drive motor 53. A cam follower 56 on one end of a third lever 55 which turns around a support axis 54 is pressed into contact with the third cam 52. A cam follower 57 on another end of the third lever 55 is engaged with a cam engagement portion 59 of a vacuum valve switch operating body 58 which is movable upward and downward corresponding to movement of the vertical shift body 47.

The vertical shift body 47 is provided with a vertical shift bar 62 for raising and lowering the suction nozzles 15. By rotation of the first cam 30 and the second cam 40, the first lever 38 and the second lever 43 turn around the support axis 29 and the support axis 42 respectively. Then, the vertical shift body 47 descends and the vertical shift bar 62 lowers the suction nozzles 15 by a predetermined stroke corresponding to a thickness of an electronic component D, thus completing mounting of the electronic component D on the printed board P.

Figure 7:
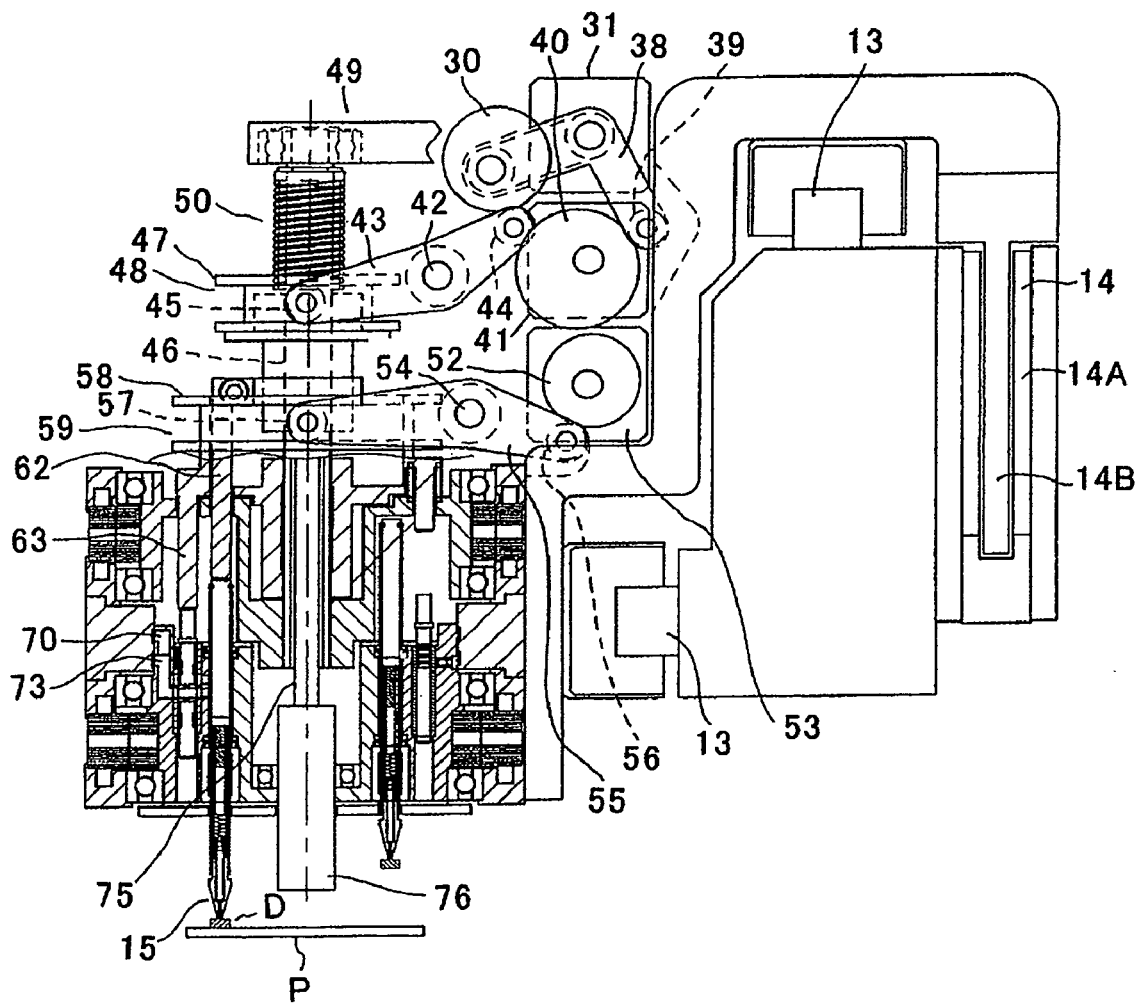
FIG. 7 is a view of a side longitudinal section of the mounting head body of the embodiment mounting a thin electronic component.
Figure 8:
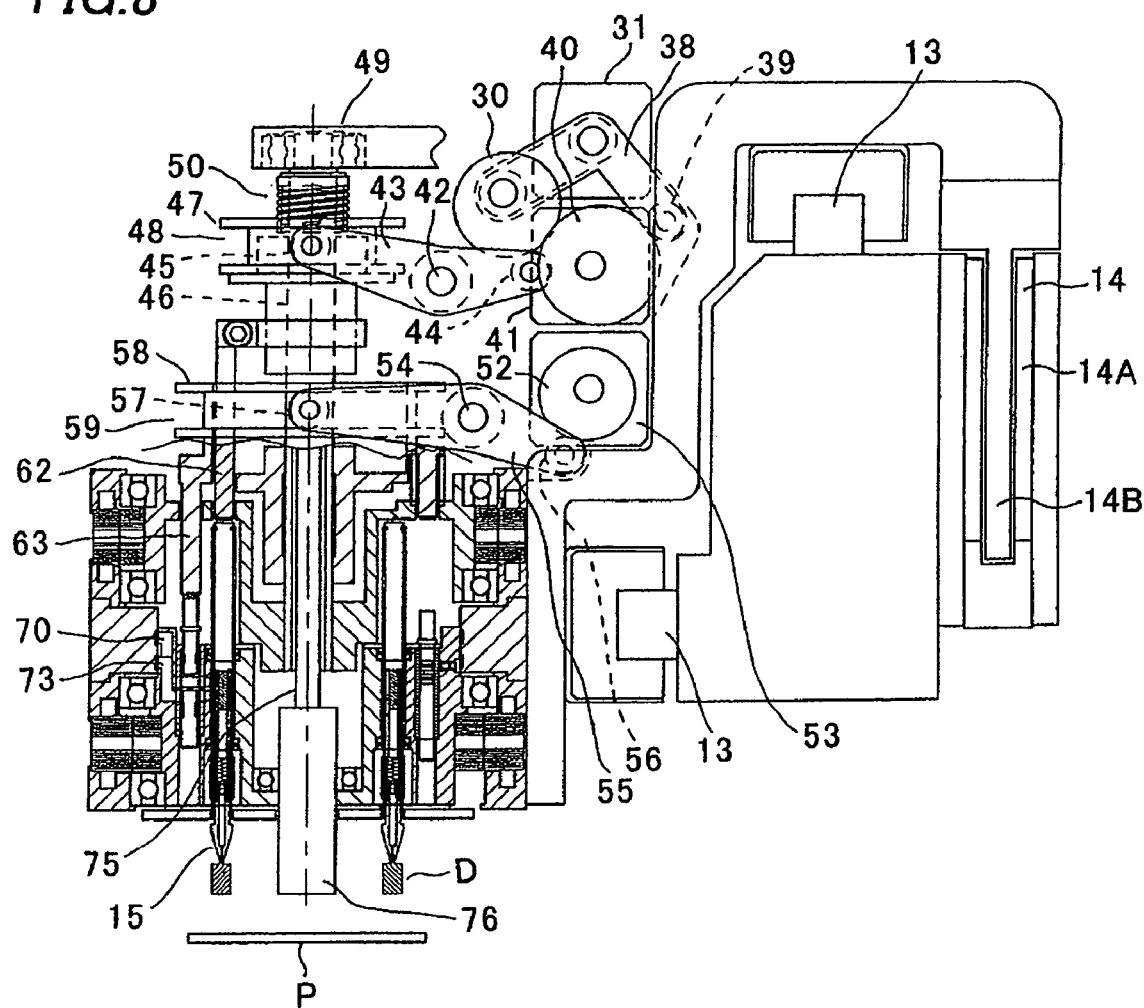
FIG. 8 is a view of a side longitudinal section of the mounting head body of the embodiment holding a thick electronic component by suction.
Figure 9:
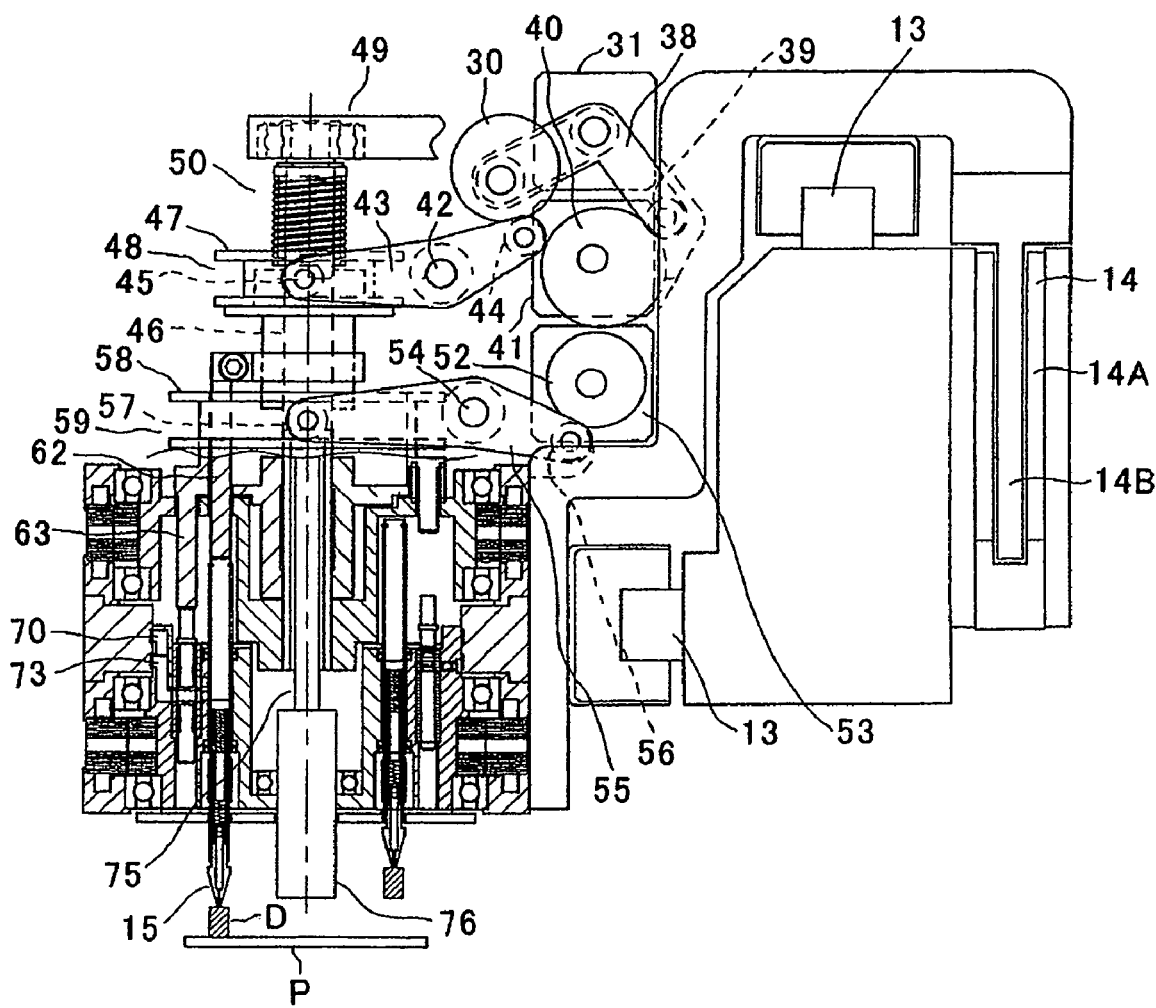
FIG. 9 is a view of a side longitudinal section of the mounting head body of the embodiment mounting a thick electronic component.
Figure 13:
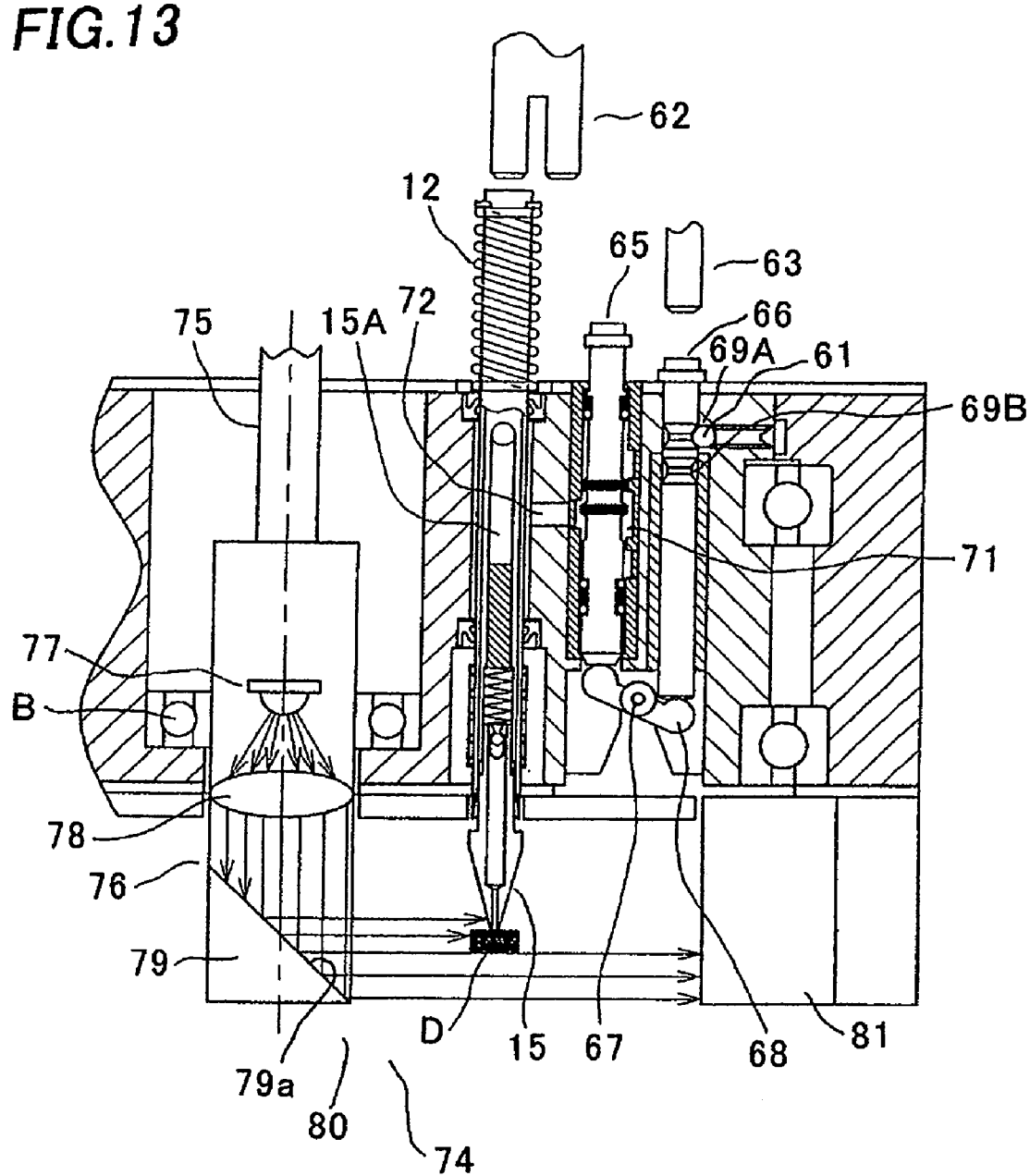
FIG. 13 is a view of a side longitudinal section of a main portion of the mounting head body of the embodiment holding a thin electronic component by suction.

When the suction nozzle 15 descends for mounting, as shown in FIGS. 7 and 9, turning of the third lever 55 by rotation of the third cam 52 makes the vacuum valve switch operating body 58 descend corresponding to descending of the vertical shift body 47 connected therewith through the cam engagement portion 59. The vertical shift bar 63 of the vacuum valve switch operating body 58 depresses a first switch bar 65 to turn a switch lever 68 around a support axis 67 and to push a second switch bar 66 upward, so that a projected stopper 61 is engaged with a recess for engagement 69B of the second switch bar 66. When picking the electronic component up, as shown in FIGS. 6, 8, and 13, the vertical shift bar 63 of the vacuum valve switch operating body 58 depresses the second switch bar 66 to turn the switch lever 68 around the support axis 67 and to push the first switch bar 65 upward, so that the projected stopper 61 is engaged with a recess for engagement 69A of the second switch bar 66.

The vacuum path is disconnected from a vacuum source and air blows in the suction nozzle 15 so as to cease the vacuum suction of the electronic component D by the suction nozzle 15 when the first switch bar 65 descends in response to the descending of the vertical shift bar 63 of the vacuum valve switch operating body 58 during the mounting. On the other hand, the vacuum path is connected to the vacuum source so as to maintain the vacuum suction of the electronic component D by the suction nozzle 15 when the second switch bar 66 descends.

That is, air from an air supply source blows in an inner path 15A of the suction nozzle 15 through an air path 70, a path 71, and a connecting path 72 in the state where the first switch bar 65 descends. On the contrary, vacuum suction is performed by connecting the inner path 15A of the suction nozzle 15 to the vacuum source through the connecting path 72, the path 71, and a vacuum path 73 in the state where the second switch bar 66 descends.

Figure 14:
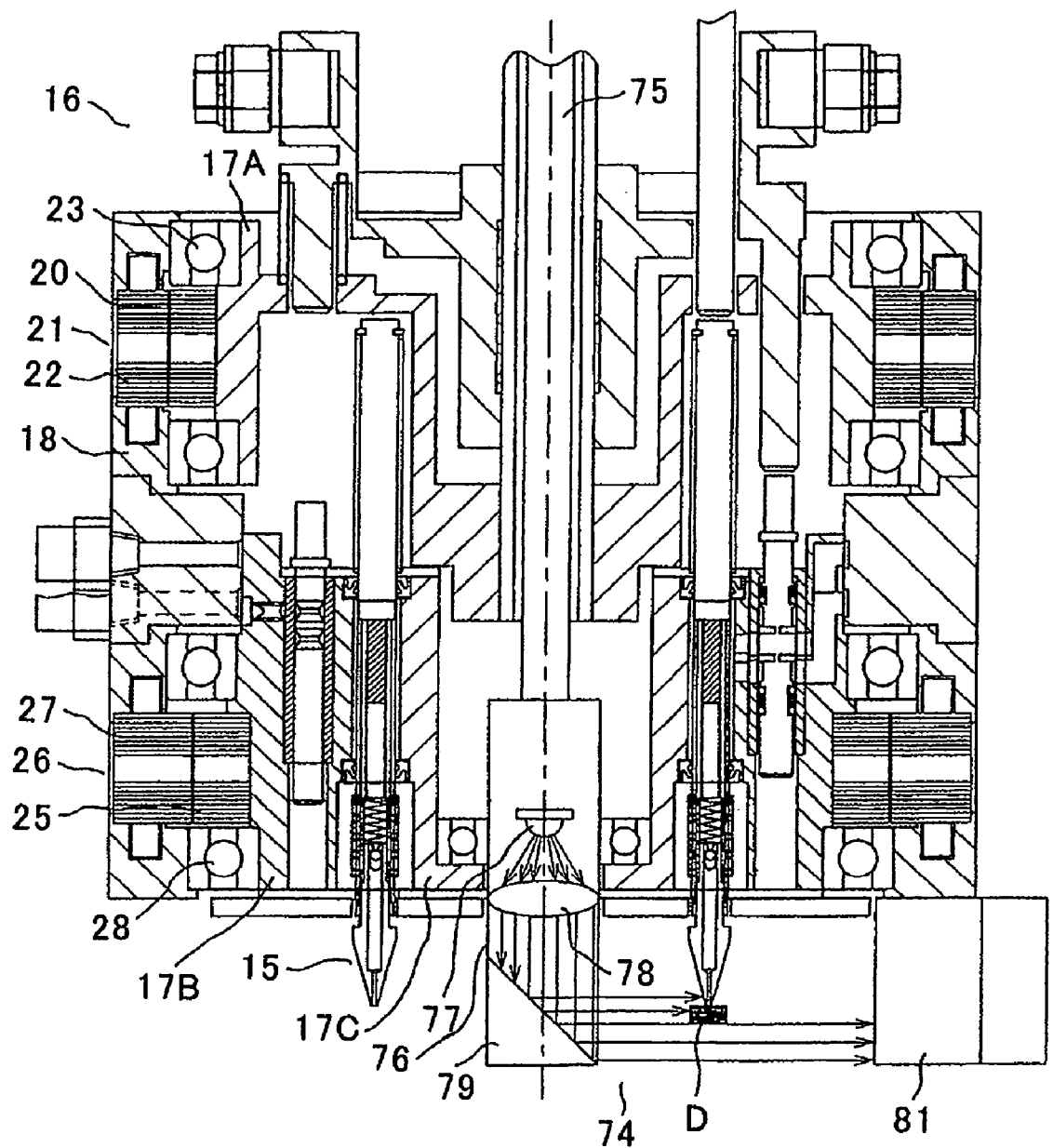
FIG. 14 is a view of a side longitudinal section of the main portion of the mounting head body of the embodiment holding the thin electronic component by suction.

A numeral 74 designates a line sensor unit for detecting presence or absence and an attached posture of an electronic component. As shown in FIGS. 13 and 14, the line sensor unit 74 has a light emitting unit 80 and a light receiving unit 81. The light emitting unit 80 has a light emitting element 77 such as an LED in an upper part of a cylindrical light emitting unit attachment body 76, a lens 78 below the light emitting element 77, and a prism 79 having a reflective surface 79a provided with an inclination of 45 degrees below the lens 78. The cylindrical light emitting unit attachment body 76 is provided on a lower end of a strut 75 provided almost in a center of each of the mounting heads 16. Bearings B are provided between the cylindrical light emitting unit attachment body 76 and the third inner cylinder 17C. A light receiving unit 81 has CCD elements as a plurality of receiving elements for receiving light emitted from the light emitting element 77 through the prism 79, being fixed on a bottom of the outer cylinder 18. The mounting head 16 with the line sensor unit 74 can be minimized by disposing the line sensor unit 74 as above.

Figure 15:
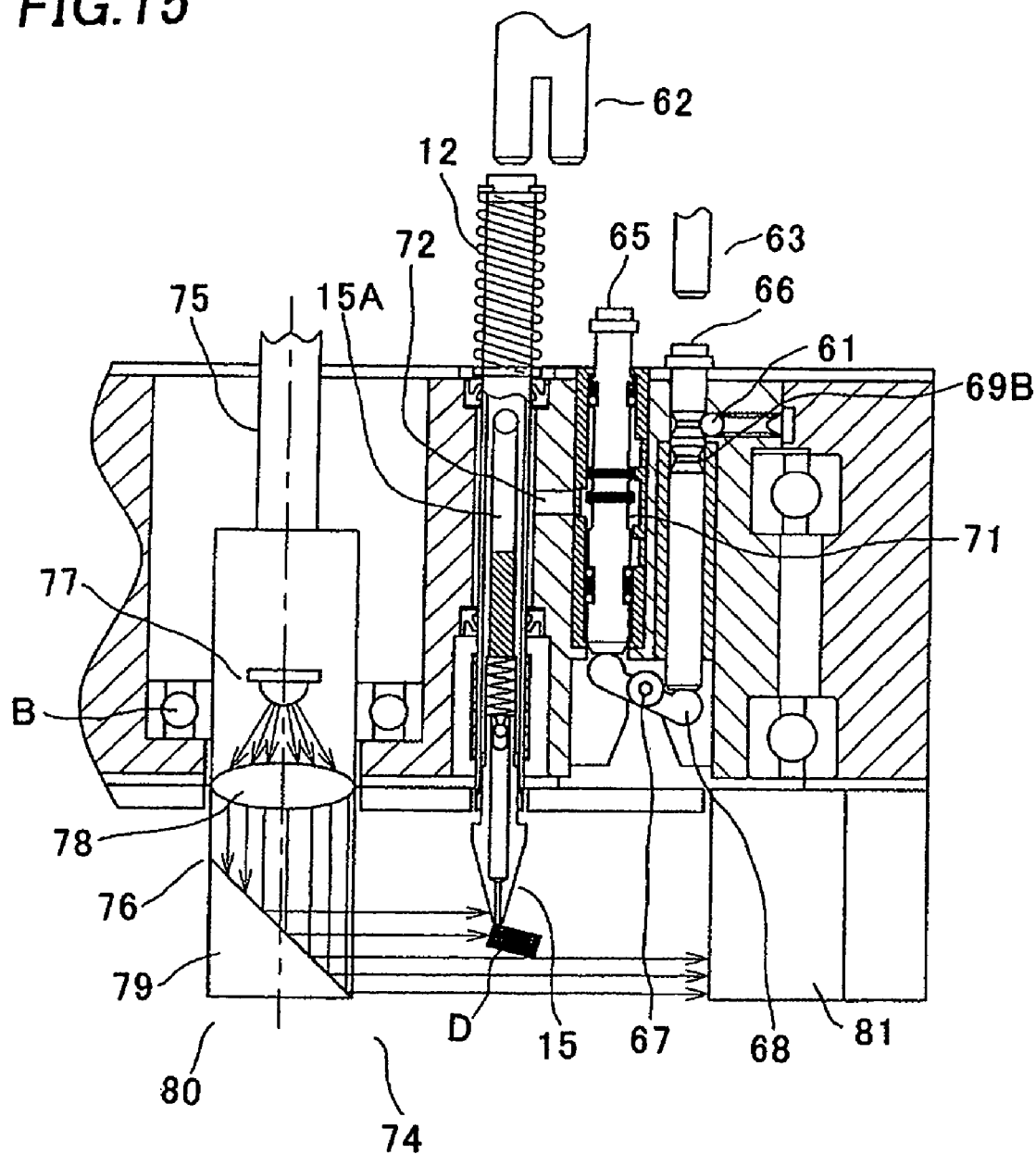
FIG. 15 is a view of a side longitudinal section of the main portion of the mounting head body of the embodiment holding and slanting the electronic component.
Figure 16:
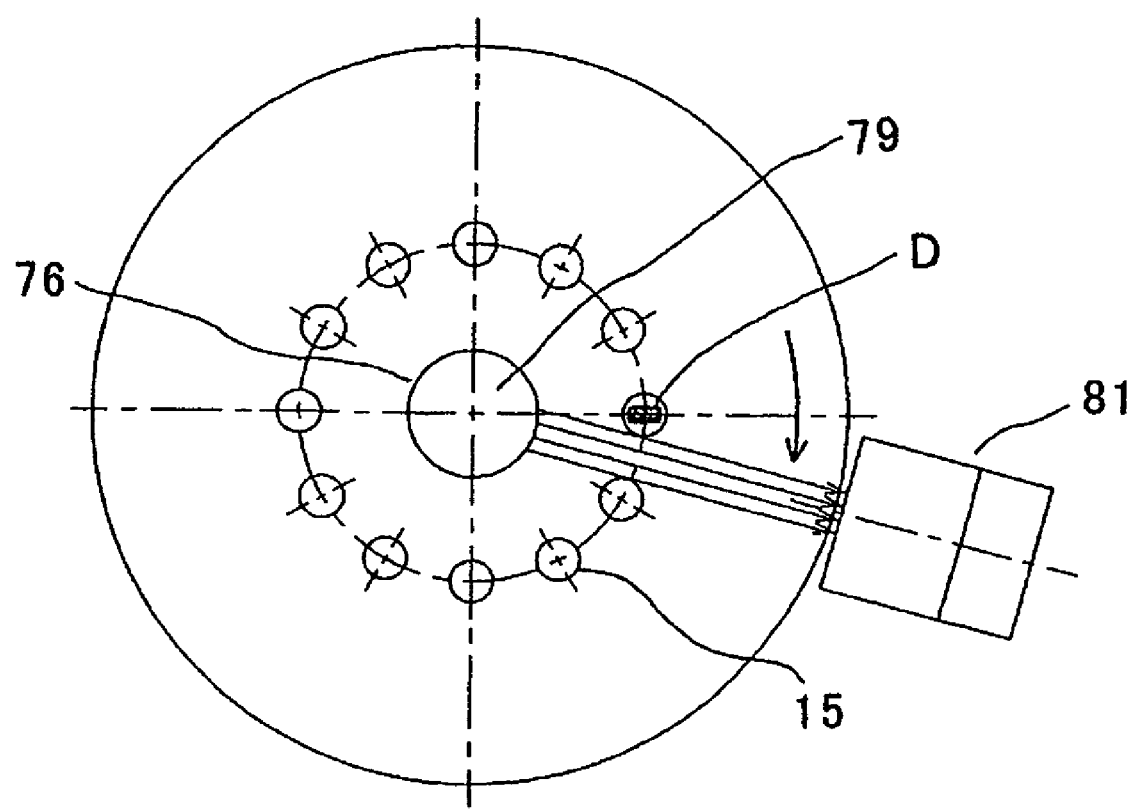
FIG. 16 shows a bottom surface of the main portion of FIG. 14.

This enables differentiating a case where the electronic component is picked up with a normal position as shown in FIG. 13 from a case where the component is picked up with its wrong surface being attached to the suction nozzle, i.e., standing or slanting (FIG. 15), since height of a lower end surface of the electronic component D can be detected by recognizing a border between the position receiving no light and the position receiving light in each of the CCD elements. That is, after the suction nozzle 15 descends, picks up the electronic component D from the component feeding unit 3 by suction, and rises up, the pulse motors 21 and 26 are driven to rotate the mounting head 16. In detail, the first inner cylinder 17A and the second inner cylinder 17B rotate around the strut 75 to rotate the suction nozzle 15 holding the electronic component D by suction. When the electronic component D held by the suction nozzle 15 comes between the prism 79 and the light receiving unit 81 while rotating of the suction nozzle 15, presence or absence, an attached posture and so on of the component can be detected by detecting height of the lower end surface of the electronic component D at plural positions. Although the detection is performed while rotating and moving of the mounting head 16 in this embodiment, alternatively the detection can be performed with the mounting head 16 being stopped between the prism 79 and the light receiving unit 81.

In a case where the electronic component D is not detected, light emitted from the light emitting element 77 is received by the light receiving unit 81. Thus, a detection result is "absence" of the electronic component D so that the vertical shift bar 63 of the vacuum valve switch operating body 58 descends to lower the first switch bar 65 and vacuum suction is stopped by disconnecting the vacuum path from the vacuum source by closing a vacuum valve (not shown), preventing leaking. In a case where the electronic component is detected as being attached to the suction nozzle 15 at its wrong surface, i.e., with standing or slanting, the mounting head 16 and the suction nozzle 15 move to a position above an exhaust box 82, drops the electronic component D therein, and performs a picking process of the electronic component D again.

Even in a case where the electronic component is detected as being attached normally, a lower end level (lower end position) of the electronic component D can be detected so that a CPU 90 controls the drive motor 31 to change an amount of a descending stroke of the suction nozzle 15 for mounting the component D on the printed board P corresponding to the lower end level. This compensates for variations in type of the components D. In detail, the drive motor 31 is driven to rotate the first cam 30 to set it at a predetermined angle and turn the second lever 43 around the support axis 42 so that the vertical shift body 47 descends and the vertical shift bar 62 lowers the suction nozzle 15 by a predetermined amount of a stroke.

A numeral 83 designates a component recognition camera. The component recognition camera 83 is provided on sliders 86 so that there are four cameras 83 in total. The cameras 83 sequentially take images of all the electronic components D picked up by the suction nozzles 15 to detect an amount of shifting from a proper position of the electronic component D on the suction nozzle 15 in X and Y directions and at rotating angles. Alternatively, the camera 83 can take images of the plurality of the electronic components D simultaneously. Furthermore, the component recognition camera 83 can recognize whether or not the electronic component D is held by suction by the suction nozzle 15 by taking an image.

As shown in FIG. 3, each of the linear motors 84 is driven, and each of sliders 86 fixed with the component recognition cameras 83 slides along a pair of left and right guides 85 and moves in parallel with a conveying direction of the printed board P on the positioning portion 5 and an alignment direction of the component feeding units 3, i.e., in the X direction. Each of the linear motors 84 has a pair of upper and lower stationary members 88 fixed to a mount 87 fixed on the base 2 and a moving member 89 provided in the slider 86.

Figure 4:
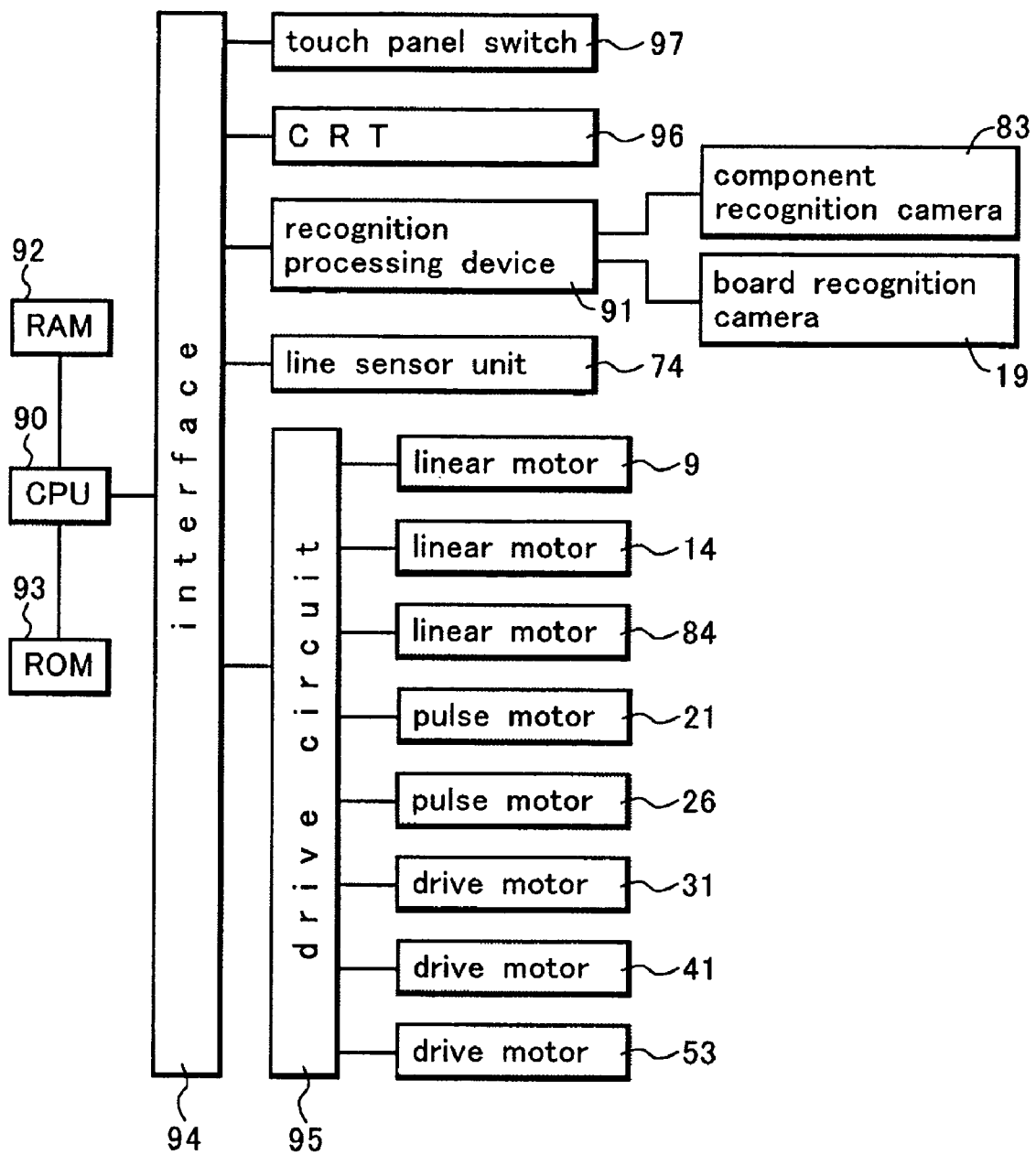
FIG. 4 is a control block diagram of the electronic component mounting apparatus of FIG. 1.

Next, description will be made with reference to a block diagram showing controlling of the electronic component mounting apparatus 1 in FIG. 4. A numeral 90 designates the CPU (mounting control portion) as a control portion for controlling the mounting apparatus 1. The CPU 90 is connected with a RAM (random access memory) 92 and a ROM (read only memory) 93 through buses. The CPU 90 controls all operation for component mounting of the electronic component mounting apparatus 1 according to programs stored in the ROM 93 based on data stored in the RAM 92. That is, the CPU 90 controls driving of the linear motors 9, 14, and 84, the pulse motors 21 and 26, and the drive motors 31, 41, and 53 through an interface 94 and a drive circuit 95.

The RAM 92 is stored with mounting data on component mounting which include values in the X and Y directions (indicated by X and Y respectively) and an angle (indicated by Z) on the printed board, alignment numbers of the component feeding units 3, and so on in order of component mounting (in order of step number). Furthermore, the RAM 92 is stored with component disposition data which include a type of the electronic component (component ID), alignment coordinates of the component feeding units 3, and so on corresponding to alignment numbers of the component feeding units 3.

A numeral 91 designates a component recognition processing device connected with the CPU 90 through the interface 94. In the component recognition processing device 91, images taken and stored by the component recognition camera 83 and the board recognition camera 19 undergo recognition processing.

The images taken by the component recognition camera 83 and the board recognition camera 19 are displayed on the CRT 96. The CRT 96 is provided with various touch panel switches 97 and an operator operates the touch panel switches 97 for various settings including settings for informing.

The touch panel switches 97 include a glass substrate which is coated with a transparent conductive film on its whole surface and printed with electrodes on its four edges. When an operator touches one of the touch panel switches 97 in a state where minimal electric currents flow on the surface of the touch panel switches 97, current flows change at the four electrodes and coordinates of a touched position are calculated by a circuit board connected with the electrodes. If the calculated coordinates correspond to one of coordinates originally stored in the RAM 92, which will be described later, as a switch for executing a certain operation, the operation is executed.

Under the structure described above, a screen as shown in FIG. 17 is displayed on the CRT 96, and then selection is made from the line sensor unit 74 only, the component recognition camera 83 only, and both the line sensor unit 74 and the component recognition camera 83, for use for detecting whether or not the suction nozzle 15 still holds the electronic component after the mounting operation of the electronic component on the printed board P. Suppose that the line sensor unit 74 only is selected for the detection, first. An operator pushes a switch portion 100A and then a decision switch 100D to set the detection by the line sensor unit 74 only. The set content is stored in the RAM 92, and the CPU 90 controls a detecting operation according to a program corresponding to the set content stored in the ROM 93.

This setting can be performed on each group of the electronic components having a same type or in mounting order in the mounting data of electronic components.

Figure 18:
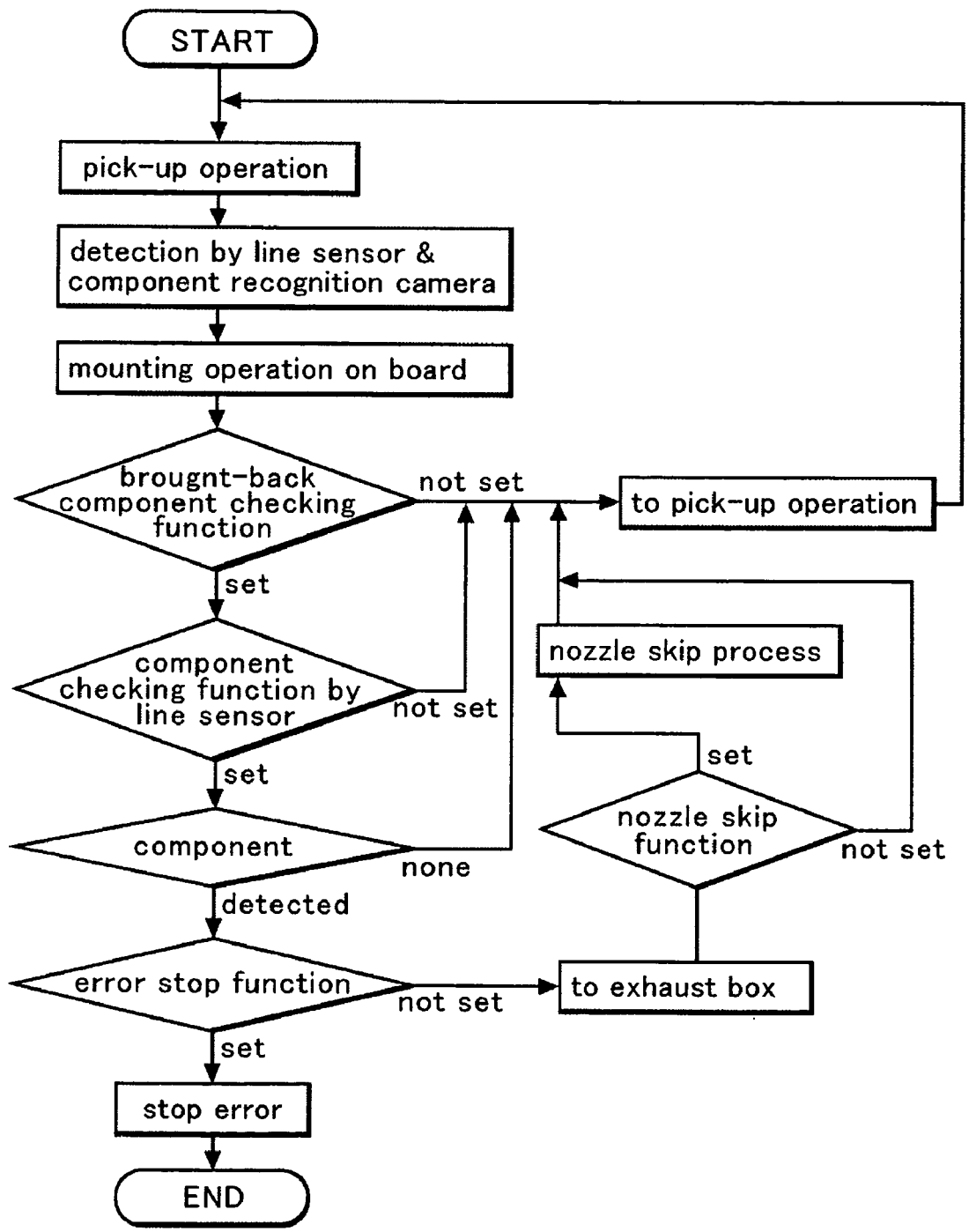
FIG. 18 is a flow chart of detection by a line sensor unit of the embodiment.

That is, control shown in a flow chart shown in FIG. 18 is performed. First, the printed board P is conveyed from upstream to the positioning portion 5 through the feed conveyer 4, and the positioning device starts a positioning operation.

Next, the CPU 90 forms pick-up sequence data from the mounting data stored in the RAM 92. That is, the CPU 90 reads out data from the mounting data, decides a picking-up procedure of the suction nozzles 15, detects the last component feeding unit 3 which feeds the last electronic component D in a sequential picking-up process (12 components can be picked up for one mounting head 16 at maximum) and stores coordinates of a last pick-up position of the component feeding unit 3 in the RAM 92, detects coordinates of a first mounting position of the component D after completing the sequential picking-up process (a position stored in mounting data before alignment) and stores the coordinates in the RAM 92, and calculates an X abscissa of a position which the component recognition cameras 83 should move to.

This is for driving and moving the component recognition cameras 83 (two cameras) in the X direction so that the cameras 83 can be previously positioned on a line which connects the last pick-up position of the component by the mounting head 16 and the first mounting position of the component on the printed board P, in a sequential picking-up process. Thus, the camera 83 can simultaneously take images of all the electronic components picked up by the suction nozzles 15 of the left and right mounting heads 16 by "on the fly recognition without stopping of the beam 8" at the time when the beam 8 is moving from the last pick-up position to the first mounting position. This prevents wasting of time for moving the beam 8 for shifting to a component recognition process.

Accordingly, after calculating the X abscissa of the position which the component recognition cameras 83 should move to, the cameras 83 moves to the calculated position. Then, picking-up of the electronic components D is performed.

In detail, the suction nozzles 15 corresponding to types of the electronic components pick up the electronic components to be mounted from the predetermined component feeding units 3 according to the mounting data and so on stored in the RAM 92 where a position of an X abscissa and a Y ordinate on the printed board to be mounted with the component, a position at a rotation angle around a vertical axis, an alignment number and so on are specified. For this pick-up operation, the suction nozzle 15 of the mounting head 16 in the mounting head body 7 moves to a position above the first electronic component in the component feeding unit 3 which has the electronic components to be mounted. Each of the head bodies 7 moves in the Y direction by moving of the beam 8 along the pair of the guides 10 driven by the linear motor 9 and in the X direction along the guides 13 driven by the linear motor 14, both the linear motors 9 and 14 being driven by the drive circuit 95.

At this time, the predetermined component feeding unit 3 is already driven and the electronic component is ready to be picked up at a feeding position of the unit 3. The suction nozzle 15 is selected by rotating of the first inner cylinder 17A and the second inner cylinder 17B of the mounting head 16 driven by the pulse motors 2 1 and 26, and positioned on one of 0, 3, 6, and 9 o'clock positions in the mounting head 16 and above the component feeding position of the component feeding unit 3. The first cam 30 rotates to set at a predetermined angle driven by the drive motor 31, the second lever 43 turns around the support axis 42, and the vertical shift body 47 descends to lower the vertical shift bar 62 so that the suction nozzle 15 descends by a predetermined stroke to firmly pick the electronic component D up from the component feeding unit 3. Then, the first cam 30 rotates to set at a predetermined angle and the second lever 43 turns so that the vertical shift body 47 rises up to raise the suction nozzle 15.

At this time, the third cam 52 rotates driven by the drive motor 53 to turn the third lever 55, the vacuum valve switch operating body 58 descends corresponding to descending of the vertical shift body 47, and the vertical shift bar 63 descends to push the second switch bar 66 downward. Then, the inner path 15A of the suction nozzle 15 becomes connected to the vacuum source through the connecting path 72, the path 71, and the vacuum path 73, so that the suction nozzle 15 picks the electronic component D up from the component feeding unit 3 by vacuum suction and rises up with the electronic component D. The mounting head 16 rotates driven by the pulse motors 21 and 26, and the first inner cylinder 17A and the second inner cylinder 17B turn around the strut 75 to rotate the suction nozzle 15 holding the electronic component D by suction. The electronic component D held by the suction nozzle 15 comes between the prism 79 and the light receiving unit 81, and detecting of presence or absence or an attached posture of the electronic component D is performed by detecting height of a lower end surface of the electronic component D at plural positions by the line sensor unit 74.

In a case where the electronic component is detected as being attached to the suction nozzle 15 at its wrong surface or with slanting (FIG. 15), the mounting head 16 and the suction nozzle 15 move to a position above the exhaust box 82, drops the electronic component D therein, and perform the pick-up operation of the electronic component D again. In a case where the electronic component D is detected as being attached normally, while keeping vacuum suction, a lower end level (lower end position) of the electronic component D can be detected, so that the CPU 90 controls the drive motor 31 to change an amount of a descending stroke of the suction nozzle 15 for mounting the component D on the printed board P corresponding to the lower end level. This compensates for variations in type of the components D.

That is, the drive motor 31 is driven to rotate the first cam 30 to set it at a predetermined angle and turn the second lever 43 around the support axis 42 so that the vertical shift body 47 descends and the vertical shift bar 62 lowers the suction nozzle 15 by a predetermined amount of a stroke for mounting of the electronic component D.

When sequential pick-up operation can be performed by the mounting head 16, the suction nozzle 15 with the component D is not lowered for mounting the component D but the pulse motors 21 and 36 are driven to rotate the mounting head 16 and to move the suction nozzle 15 selected for a next pick-up operation to a position above a component feeding position of the component feeding unit 3. Then, as described above, the first cam 30 rotates and the vertical shift bar 62 descends so that the selected suction nozzle 15 descends by a predetermined stroke, picks the electronic component D up from the component feeding unit 3, and rises up. Detecting of presence or absence or an attached posture of the electronic component D is performed by the line sensor unit 74 as above.

After that, multiple picking (sequential pick-up of the components as much as possible) is performed, similarly. When completing this multiple pick-up operation, the CPU 90 forms mounting sequence data and moves the beam 8 and the mounting heads 16 to a first mounting position where the component D is mounted on the printed board P first. That is, the CPU 90 stores coordinates of the first mounting position (a position stored in the mounting data before alignment of a pick-up position), where the electronic component D is mounted first, in the RAM 92 and set it as a coordinate value of a moving target position. Then, the CPU 90 moves the component recognition cameras 83 on a line which connects the last pick-up position of the component by the mounting head 16 and the first mounting position of the component on the printed board P by the mounting head 16.

Then, when the CPU 90 detects timing for the component recognition cameras 83 to take images, that is, timing where the mounting heads 16 passes above the cameras 83, the CPU makes the cameras 83 positioned on the line simultaneously take and store images of all the electronic components D picked up by the suction nozzles 15 of the left and right mounting heads 16 by "on the fly recognition without stopping of the beam 8" while the beam 8 is moving from the last pick-up position to the first mounting position. Then, the component recognition processing device 91 starts a component recognition process.

When a recognition result for the first component to be mounted is calculated by the component recognition processing device 91, the CPU detects whether the suction nozzle 15 is positioned on a first mounting position (a position in mounting data before alignment of a pick-up position) which is set as the coordinate value of the moving target position. If positioned, the CPU resets the coordinate value into a coordinate value of a moving target position calculated with the recognition (alignment) result and moves the beam 8 for positioning the suction nozzle 15 on a position of the reset target value. If not positioned, the set coordinate value of the moving target position is dynamically changed to the coordinate value calculated with the recognition (alignment) result.

When completing moving of the beam 8, the first electronic component D among the components D sequentially picked up by the suction nozzle 15 is mounted on the printed board P.

In detail, the first cam 30 rotates driven by the drive motor 31 and the second cam 40 rotates driven by the drive motor 41, the second lever 43 turns to set at a predetermined angle around the support axis 42, and the vertical shift body 47 descends to lower the vertical shift bar 62. Thus, the suction nozzle 15 descends by a predetermined stroke corresponding to a thickness of the electronic component D and a lower end level thereof detected by the line sensor unit 74 and mounts the electronic component D on the printed board P (FIGS. 7 and 9).

On this mounting process, the vertical shift bar 63 of the vacuum valve switch operating body 58 descends to push the first switch bar 65 downward so that the vacuum path is disconnected from the vacuum source to stop the vacuum suction and air from the air supply source blows in the inner path 15A of the suction nozzle 15 through the air path 70, the path 71, and the connecting path 72. That is, when the suction nozzle 15 descends for mounting, the third cam 52 rotates to turn the third lever 55 and the vacuum valve switch operating body 58 descends corresponding to descending of the vertical shift body 47 through the cam engagement portion 59. Then, the vertical shift bar 63 of the operation body 58 pushes the first switch bar 65 downward, and the switch lever 68 turns around the support axis 67 to push the second switch bar 66 upward. The projected stopper 61 is engaged with the recess for engagement 69B of the second switch bar 66 so that the vacuum path is disconnected from the vacuum source to stop the vacuum suction.

The CPU 90 calculates next mounting operation of the electronic component D and repeats the mounting operation until all the picked electronic components D are mounted. In detail, the CPU 90 receives a recognition result calculated by the component recognition processing device 91, calculates a coordinate value of a moving target position in X, Y, and θ. Then, the CPU 90 drives the linear motor 9 to move the beam 8 in the Y direction to a target coordinate value calculated with the recognition result, drives the linear motor 14 to move the mounting head 16 in the X direction, and drives the pulse motors 21 and 26 to rotate the suction nozzle 15 to set at a θ angle. The first cam 30 and the second cam 40 rotate so that the suction nozzle 15 descends by a predetermined stroke corresponding to a thickness of the electronic component D and mounts the electronic component D on the printed board P. The CPU repeats this operation until all the electronic components D picked up by the suction nozzle 15 of the mounting head 16 are mounted.

Then, the CPU 90 checks whether or not the brought-back component checking function is set. When the brought-back component checking function is not set, that is, the RAM 92 does not have a setting content of the brought-back component checking function, the electronic component pick-up operation according to the next mounting data, which is described above, will be performed.

Here, when the RAM 92 has the setting content of the brought-back component checking function, the CPU 90 checks whether or not a component checking function by the line sensor unit 74 is set. When the RAM 92 does not have a setting content of the component checking function by the line sensor unit 74, the electronic component pick-up operation according to the next mounting data, which is described above, will be performed. When the RAM 92 has the setting content of the component checking function by the line sensor unit 74, the line sensor unit 74 performs detection of presence or absence of the electronic component while the suction nozzle 15 of the mounting head 16 is moving to each of the component feeding units 3 storing the electronic component for next mounting.

When a result of the detection of presence or absence of the electronic component performed by the line sensor unit 74 is "absence", the pick-up operation of the electronic component for next mounting starts. When the result is "presence", the CPU 90 checks whether or not the RAM 92 has a setting content of an error stop function. When the RAM 92 has the setting content of the error stop function, the CPU 90 controls the electronic component mounting apparatus 1 to stop the operation. When the RAM 92 does not have the setting content of the error stop function, the CPU 90 controls the suction nozzle 15 to move to a position above the exhaust box 82 and perform a discharging operation of the electronic component D.

After the discharging operation, the CPU 90 checks whether or not a setting content of a nozzle skip function is stored in the RAM 92. When the nozzle skip function is not stored in the RAM 92, a pick-up operation of a next electronic component to be picked up starts. When the nozzle skip function is stored in the RAM 92, a skip process is performed to the appropriate suction nozzle 15 and the pick-up operation of the next electronic component to be picked up starts.

There are twelve suction nozzles 15 attached to the mounting head 16 and some of the suction nozzles 15 are of same type. In the skip process, the CPU 90 controls so that the suction nozzle 15 which brings back the electronic component is not used but the other suction nozzle 15 of same type is used instead.

When all the electronic components D specified in the mounting data are not mounted on the printed board P, the pick-up sequence data is formed again as described above, and the pick-up operation, the component recognition processing, and the mounting operation of the electronic components D are performed. When all the electronic components D specified in the mounting data are mounted on the printed board P, the beam 8 is returned to an original position, and the printed board P completing component mounting is mounted on the discharging conveyer 6, completing the mounting operation.

Figure 17:
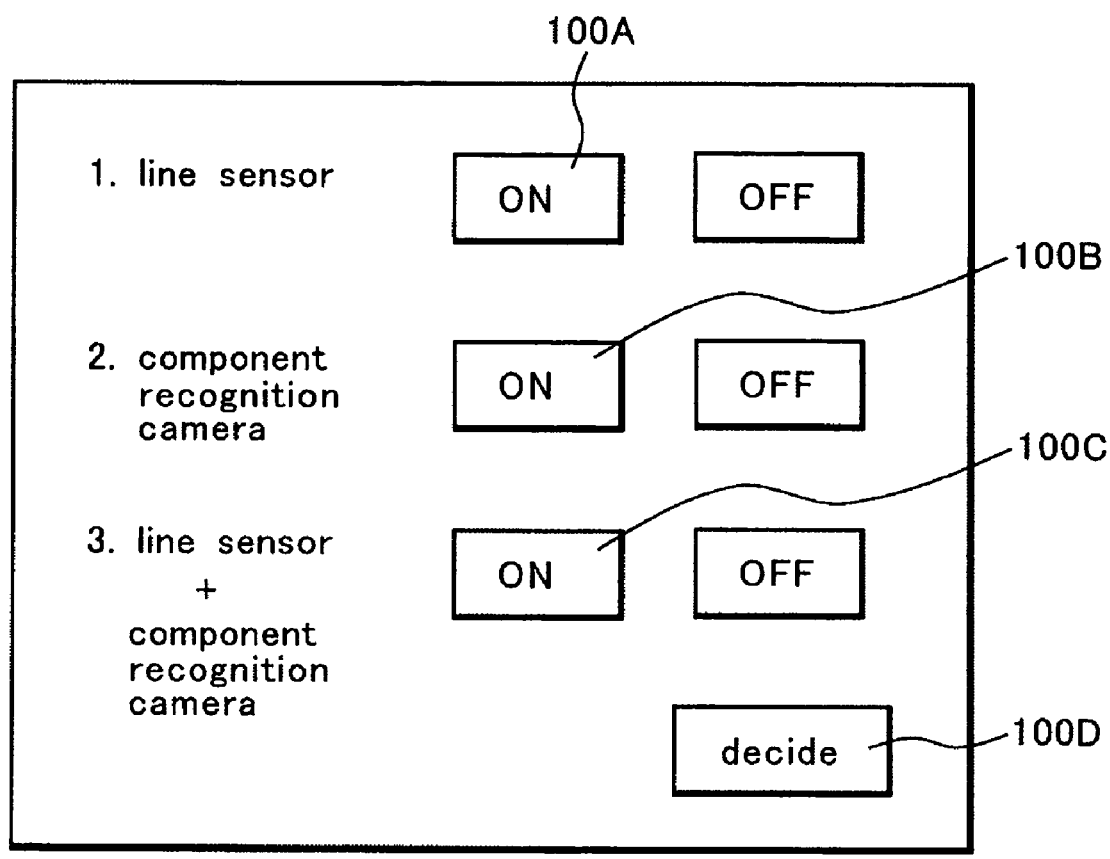
FIG. 17 is a view showing an operating screen displayed on a CRT of the embodiment.

In the next case, the screen as shown in FIG. 17 is displayed on the CRT 96, and then the component recognition camera 83 only is selected for use for detecting whether or not the suction nozzle 15 still holds the electronic component after the component mounting operation on the printed board P. An operator pushes a switch portion 100B and then the decision switch 100D to set the detection by the component recognition camera 83 only. The CPU then controls a detecting operation according to a program corresponding to the set content stored in the ROM 93.

Figure 19:
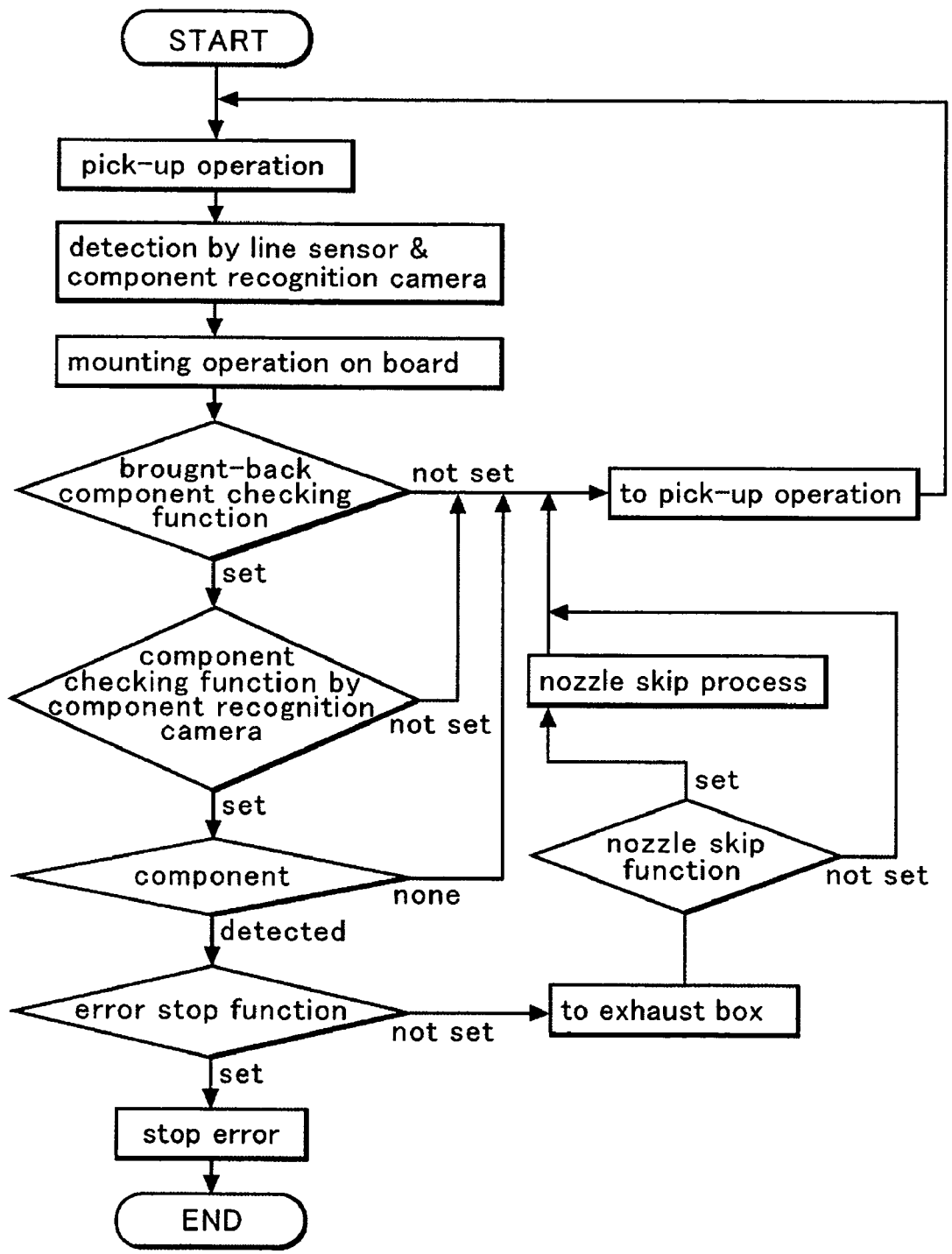
FIG. 19 is a flow chart of detection by a component recognition camera of the embodiment.

That is, control shown in a flow chart shown in FIG. 19 is performed. In this control, detection processing of the brought-back electronic component as shown in FIG. 18 is performed by the component recognition camera 83 and the component recognition processing device 91 only, instead of by the line sensor unit 74.

In the explanation below, some features of the mounting operation that have been already explained with respect to the line sensor unit only detection will be omitted. First, the printed board P is conveyed to the positioning portion 5 and positioned there, and the CPU 90 forms pick-up sequence data from the mounting data stored in the RAM 92. Then, the component recognition cameras 83 (two cameras) are driven and moved in the X direction, so that the cameras 83 can simultaneously take images of all the electronic components picked up by the suction nozzles 15 of the left and right mounting heads 16 by "on the fly recognition without stopping of the beam 8" at the time when the beam 8 is moving from the last pick-up position to the first mounting position which will be described below.

Then, the suction nozzle 15 corresponding to type of the electronic component picks up the electronic component to be mounted from the predetermined component feeding unit 3 according to the mounting data and so on. After picking up the electronic component D, the suction nozzle 15 rises up, and the pulse motors 21 and 26 are driven to rotate the mounting head 16 and the suction nozzle 15. The picked electronic component D is positioned between the prism 79 and the light receiving unit 81 during this rotation, so that detection of presence or absence and an attached posture of the electronic component D is performed by the line sensor unit 74.

When the electronic component D is detected as being attached normally, while keeping vacuum suction, a lower end level of the electronic component D can be detected so that the CPU 90 controls the drive motor 31 to change an amount of a descending stroke of the suction nozzle 15 for mounting the component D on the printed board P corresponding to the lower end level. This compensates for variations in type of the components D.

After that, multiple picking (sequential pick-up of the components as much as possible) is performed, similarly. When completing this multiple pick-up operation, the CPU 90 forms mounting sequence data and moves the beam 8 and the mounting heads 16 to a first mounting position where the component D is mounted on the printed board P first.

Then, when the CPU 90 detects timing for the component recognition cameras 83 to take images, the CPU makes the cameras 83 simultaneously take and store images of all the electronic components D picked up by the suction nozzles 15 of the left and right mounting heads 16 by "on the fly recognition without stopping of the beam 8" while the beam 8 is moving from the last pick-up position to the first mounting position. Then, the component recognition processing device 91 starts a component recognition process.

When moving of the beam 8 is completed, the first electronic component D among the components D sequentially picked up by multiple picking (sequential pick-up of the components as much as possible) is mounted on the printed board P.

The CPU 90 calculates a next mounting operation of the other electronic component D, and repeats the mounting operation until all the picked electronic components D are mounted.

Then, the CPU 90 checks whether or not the brought-back component checking function is set. When the brought-back component checking function is not set, that is, the RAM 92 does not have a setting content of the brought-back component checking function, the electronic component pick-up operation according to the next mounting data, which is described above, will be performed.

When the RAM 92 has the setting content of the brought-back component checking function, the CPU 90 checks whether or not a component checking function by the component recognition camera 83 and the component recognition processing device 91 is set. When the RAM 92 does not have a setting content of the component checking function by the component recognition camera 83 and the component recognition processing device 91, the electronic component pick-up operation according to the next mounting data, which is described above, will be performed. When the RAM 92 has the setting content of the component checking function by the component recognition camera 83 and the component recognition processing device 91, the component recognition camera 83 takes an image and the component recognition processing device 91 performs recognition processing based on the image taken to perform the detection of presence or absence of the electronic component while the suction nozzle 15 of the mounting head 16 is moving to the component feeding unit 3 storing the electronic component for next mounting.

When a result of the detection of presence or absence of the electronic component D performed by the component recognition camera 83 and the component recognition processing device 91 is "absence", the pick-up operation of the electronic component for next mounting starts. On the contrary, when the result is "presence", the CPU 90 checks whether or not the RAM 92 has the setting content of the error stop function. When the RAM 92 has the setting content of the error stop function, the CPU 90 controls the electronic component mounting apparatus 1 to stop the operation. When the RAM 92 does not have the setting content of the error stop function, the CPU 90 controls the suction nozzle 15 to move to a position above the exhaust box 82 and perform a discharging operation of the electronic component D.

After the discharging operation, the CPU 90 checks whether or not the setting content of the nozzle skip function is stored in the RAM 92. When the nozzle skip function is not stored in the RAM 92, a pick-up operation of a next electronic component to be picked up starts. When the nozzle skip function is stored in the RAM 92, the skip process is performed to the appropriate suction nozzle 15 and the pick-up operation of the next electronic component to be picked up starts.

That is, there are twelve suction nozzles 15 attached to the mounting head 16 and some of the suction nozzles 15 are of same type. In the skip process, the CPU 90 controls so that the suction nozzle 15 which brings back the electronic component D is not used but the other suction nozzle 15 of same type is used instead.

When all the electronic components D specified in the mounting data are not mounted on the printed board P, the pick-up sequence data is formed again as described above, and the pick-up operation, the component recognition processing, and the mounting operation of the electronic component D are performed. When all the electronic components D specified in the mounting data are mounted on the printed board P, the beam 8 is returned to an original position, and the printed board P completing component mounting is mounted on the discharging conveyer 6, completing the mounting operation.

In the next case, the screen as shown in FIG. 17 is displayed on the CRT 96, and then the line sensor unit 74 and the component recognition camera 83 are selected for use for detecting whether or not the suction nozzle 15 still holds the electronic component for mounting, which is small, after the component mounting operation on the printed board P. An operator pushes a switch portion 100C and then the decision switch 100D to set the detection by the line sensor unit 74 and the component recognition camera 83. The CPU then controls a detecting operation according to a program corresponding to the set content stored in the ROM 93. This selection increases certainty in detection of presence or absence of an electronic component, since the detection result is "error" when either the line sensor unit 74 or the component recognition camera 83 detects the electronic component.

Figure 20:
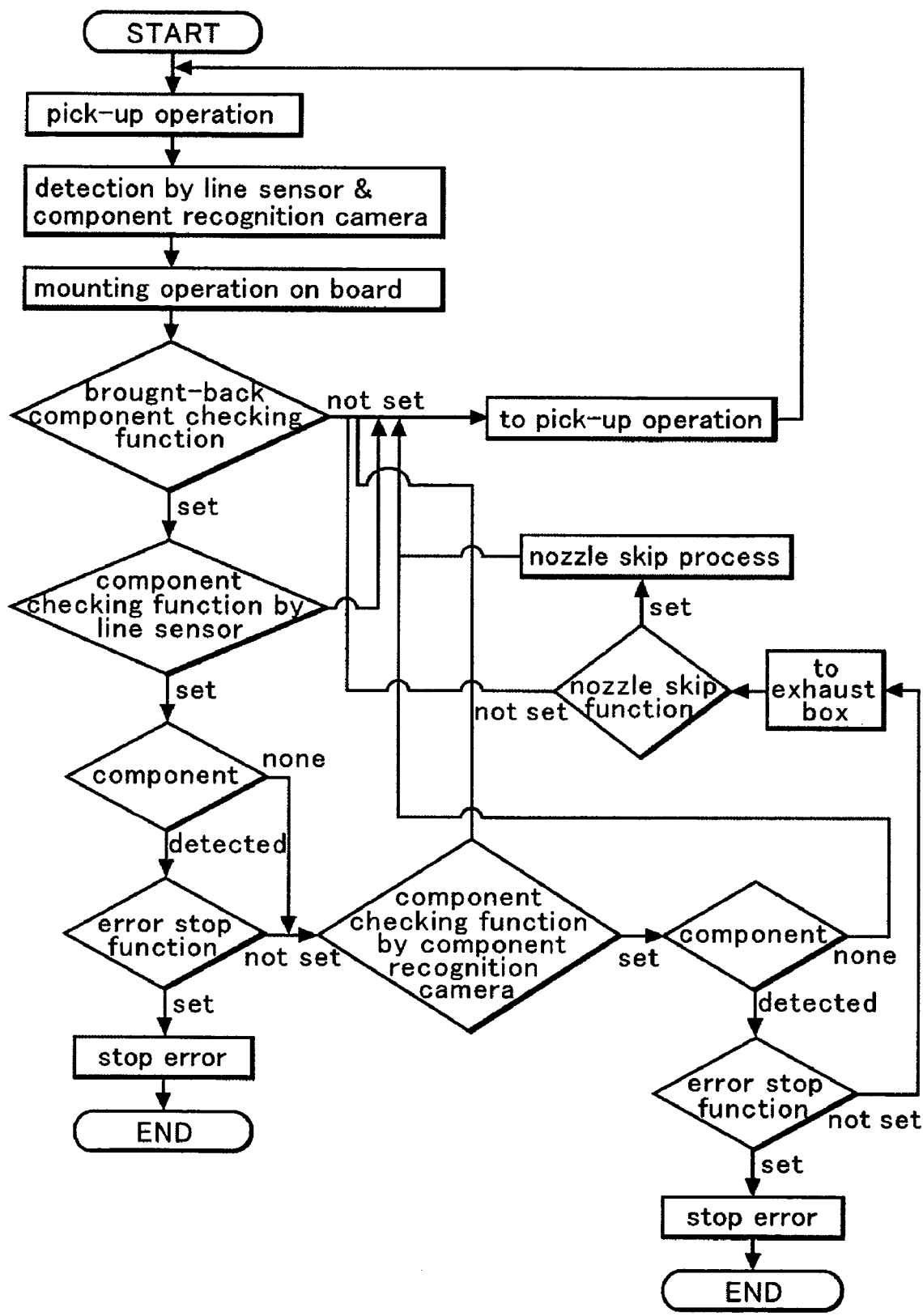
FIG. 20 is a flow chart of detection by the line sensor unit and the component recognition camera of the embodiment.

That is, control shown in a flow chart of FIG. 20 is performed. First, the printed board P is conveyed to the positioning portion 5 and positioned there, and the CPU 90 forms pick-up sequence data from the mounting data stored in the RAM 92. Then, the component recognition cameras 83 (two cameras) are driven and moved in the X direction, so that the cameras 83 can simultaneously take images of all the electronic components picked up by the suction nozzles 15 of the left and right mounting heads 16 by "on the fly recognition without stopping of the beam 8" at the time when the beam 8 is moving from the last pick-up position to the first mounting position which will be described below.

Then, the suction nozzle 15 corresponding to type of the electronic component picks up the electronic component to be mounted from the predetermined component feeding unit 3 according to the mounting data and so on. After picking up the electronic component D, the suction nozzle 15 rises up, and the pulse motors 21 and 26 are driven to rotate the mounting head 16 and the suction nozzle 15. The picked electronic component D is positioned between the prism 79 and the light receiving unit 81 during this rotation, so that detection of presence or absence and an attached posture of the electronic component D is performed by the line sensor unit 74.

When the electronic component D is detected as being attached normally, while keeping vacuum suction, a lower end level of the electronic component D can be detected so that the CPU 90 controls the drive motor 31 to change an amount of a descending stroke of the suction nozzle 15 for mounting the component D on the printed board P corresponding to the lower end level. This compensates for variations in type of the components D.

After then, multiple picking (sequential pick-up of the components as much as possible) is performed, similarly. When completing this multiple pick-up operation, the CPU 90 forms mounting sequence data and moves the beam 8 and the mounting heads 16 to a first mounting position where the component D is mounted on the printed board P first.

Then, when the CPU 90 detects timing for the component recognition cameras 83 to take images, the CPU makes the cameras 83 simultaneously take and store images of all the electronic components D picked up by the suction nozzles 15 of the left and right mounting heads 16 by "on the fly recognition without stopping of the beam 8" while the beam 8 is moving from the last pick-up position to the first mounting position. Then, the component recognition processing device 91 starts a component recognition process.

When moving of the beam 8 is completed, the first electronic component D among the components D sequentially picked up by multiple picking (sequential pick-up of the components as much as possible) is mounted on the printed board P. The CPU 90 calculates a next mounting operation of the other electronic component D, and repeats the mounting operation until all the picked electronic components D are mounted.

Then, the CPU 90 checks whether or not the brought-back component checking function is set. When the brought-back component checking function is not set, that is, the RAM 92 does not have a setting content of the brought-back component checking function, the electronic component pick-up operation according to the next mounting data, which is described above, will be performed.

When the RAM 92 has the setting content of the brought-back component checking function, the CPU 90 checks whether or not the component checking function by the line sensor unit 74 is set. When the RAM 92 does not have a setting content of the component checking function by the line sensor unit 74, the electronic component pick-up operation according to the next mounting data, which is described above, will be performed. When the RAM 92 has the setting content of the component checking function by the line sensor unit 74, the line sensor unit 74 performs detection of presence or absence of the electronic component while the suction nozzle 15 of the mounting head 16 is moving to the component feeding unit 3 storing the electronic component for next mounting.

When a result of the detection of presence or absence of the electronic component D performed by the line sensor unit 74 is "absence", the CPU 90 checks whether or not the component recognition function for detecting presence or absence of the electronic component by the component recognition camera 83 and the component recognition processing device 91 is set. When a setting content of this component recognition function is not set in the RAM 92, the pick-up operation of the electronic component for next mounting starts. On the contrary, when the setting content of the component recognition function is set in the RAM 92, the component recognition camera 83 and the component recognition processing device 91 performs the detection of presence or absence of the electronic component.

Then, when the result of the detection by the line sensor unit 74 is "absence" and also a result of the detection by the component recognition camera 83 and the component recognition processing device 91 is "absence", the electronic component pick-up operation according to the next mounting data, which is described above, will be performed.

On the contrary, when the result of the detection by the line sensor unit 74 is "absence" but the result of the detection by the component recognition camera 83 and the component recognition processing device 91 is "presence", the CPU 90 checks whether or not the setting content of the error stop function is stored in the RAM 92. When the error stop function is stored in the RAM 92, the CPU 90 controls the electronic component mounting apparatus 1 to stop the operation. When the error stop function is not stored in the RAM 92, the CPU 90 controls the suction nozzle 15 to move to a position above the exhaust box 82 and perform a discharging operation of the electronic component D.

After the discharging operation, the CPU 90 checks whether or not the setting content of the nozzle skip function is stored in the RAM 92. When the nozzle skip function is not stored in the RAM 92, a pick-up operation of a next electronic component to be picked up starts. When the nozzle skip function is stored in the RAM 92, the skip process is performed to the appropriate suction nozzle 15 and the pick-up operation of the next electronic component to be picked up starts.

That is, there are twelve suction nozzles 15 attached to the mounting head 16 and some of the suction nozzles 15 are of same type. In the skip process, the CPU 90 controls so that the suction nozzle 15 which brings back an electronic component is not used but the other suction nozzle 15 of same type is used instead.

When all the electronic components D specified in the mounting data are not mounted on the printed board P, the pick-up sequence data is formed again as described above, and the pick-up operation, the component recognition processing, and the mounting operation of the electronic component D are performed. On the contrary, when all the electronic components D specified in the mounting data are mounted on the printed board P, the beam 8 is returned to an original position, and the printed board P completing component mounting is mounted on the discharging conveyer 6, completing the mounting operation.

When the result of the detection by the line sensor unit 74 is "presence", the CPU 90 checks whether or not the setting content of the error stop function is stored in the RAM 92. When the error stop function is stored in the RAM 92, the CPU 90 controls the electronic component mounting apparatus 1 to stop the operation. When the error stop function is not stored in the RAM 92, the CPU 90 checks whether the component recognition function for detecting presence or absence of the electronic component by the component recognition camera 83 and the component recognition processing device 91 is set.

Then, when the setting content of this component recognition function is not set in the RAM 92, the pick-up operation of the electronic component for next mounting starts. On the contrary, when the setting content of the component recognition function is set in the RAM 92, the component recognition camera 83 and the component recognition processing device 91 perform the detection of presence or absence of the electronic component.

Then, a result of the detection by the component recognition camera 83 and the component recognition processing device 91 is "absence", the electronic component pick-up operation according to the next mounting data, which is described above, will be performed. However, when the result of the detection by the line sensor unit 74 is "presence" and the result of the detection by the component recognition camera 83 and the line sensor unit 74 is also "presence", the CPU 90 checks whether or not the setting content of the error stop function is stored in the RAM 92. When the error stop function is stored in the RAM 92, the CPU 90 controls the electronic component mounting apparatus 1 to stop the operation. When the error stop function is not stored in the RAM 92, the CPU 90 controls the suction nozzle 15 to move to a position above the exhaust box 82 and perform a discharging operation of the electronic component D. Note that it is possible to inform an operator of a running state by error alarming, for example, display on the CRT 96 and sound by a buzzer, at the same time as when the mounting operation stops based on the set error stop function.

After the discharging operation, the CPU 90 checks whether or not the setting content of the nozzle skip function is stored in the RAM 92. When the nozzle skip function is not stored in the RAM 92, a pick-up operation of a next electronic component to be picked up starts. When the nozzle skip function is stored in the RAM 92, the skip process is performed to the appropriate suction nozzle 15 and the pick-up operation of the next electronic component to be picked up starts.

That is, there are twelve suction nozzles 15 attached to the mounting head 16 and some of the suction nozzles 15 are of same type. In the skip process, the CPU 90 controls so that the suction nozzle 15 which brings back an electronic component is not used but the other suction nozzle 15 of same type is used instead.

Figure 21:
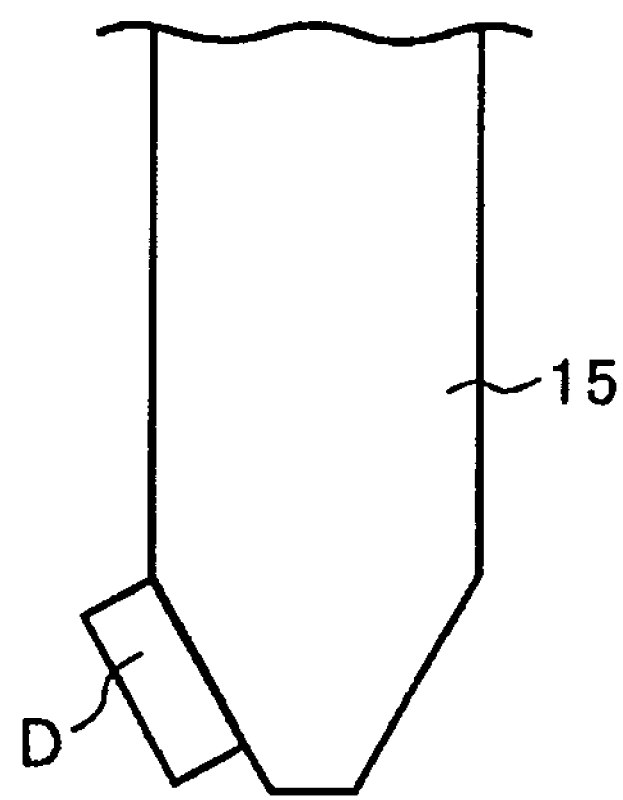
FIG. 21 is a side view of the suction nozzle holding an electronic component by magnetism on its side surface.
Figure 22:
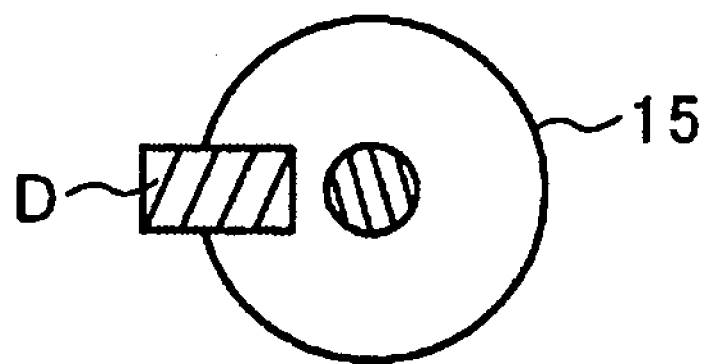
FIG. 22 is shows an image of the electromagnetic component of shown in FIG. 21 that is taken by the component recognition camera and displayed on a screen.

When the electronic component D is attached to a side surface of the suction nozzle 15 with magnetization as shown in FIG. 21, there sometimes arises a case where the electronic component is still attached to the suction nozzle 15 even after the mounting operation. In this case, if the line sensor unit 74 only is used for detection, the result of the detection is sometimes "absence " although the electronic component D is attached there (not mounted on the printed board P). However, as shown in FIG. 22, when the component recognition camera 83 and the component recognition processing device 91 are used for detection in addition to the line sensor unit 74, the electronic component held by the suction nozzle 15 can be detected without fail since the component recognition camera 83 and the component recognition processing device 91 can detect the electronic component and indicates "presence". This can provide the electronic component mounting apparatus which can perform various processes in the case where the electronic component is held by the suction nozzle 15 even after the mounting operation.

Furthermore, selection of the switch portions 100A, 100B, and 100C enables selecting of component detecting methods after the mounting operation according to sizes of the electronic components, for example, while taking much account of accuracy in component detection for smaller components or a mounting speed for larger components, for which the line sensor unit only operation may be used.

Although particular preferred embodiment of the invention has been disclosed in detail, it will be recognized that variations or modifications of the disclosed apparatus are possible based on the disclosure for those skilled in the art and lie within the scope of the present invention.

What is claimed is:

1. An electronic component mounting apparatus comprising:
- a plurality of component feeding units feeding electronic components to component pick-up positions;
- a suction nozzle picking up one of the electronic components from one of the component feeding units and mounting the picked up electronic component on a printed board;
- a line sensor unit detecting the electronic component picked up by the suction nozzle;
- a component recognition camera recognizing a position of the electronic component picked up by the suction nozzle;
- a mounting head housing the line sensor unit and the suction nozzle and configured to travel between the component pick-up positions and the printed board; and
- a selection device selecting the line sensor unit, the component recognition camera or both the line sensor unit and the component recognition camera so as to determine whether the electronic component picked by the suction nozzle is still held by the suction nozzle after an attempt to mount the electronic component on the printed board.

2. An electronic component mounting apparatus comprising:
- a plurality of component feeding units feeding electronic components to component pick-up positions;
- a suction nozzle picking up one of the electronic components from one of the component feeding units and mounting the picked up electronic component on a printed board;
- a line sensor unit detecting the electronic component picked up by the suction nozzle;
- a component recognition camera recognizing a position of the electronic component picked up by the suction nozzle;
- a mounting head housing the line sensor unit and the suction nozzle; and
- a control device that controls the line sensor unit and the component recognition camera so that the component recognition camera detects the electronic component still held by the suction nozzle after an attempt to mount the picked up electronic component on the printed board when the line sensor unit fails to detect the electronic component held by the suction nozzle.

3. The electronic component mounting apparatus of claim 2, wherein the control device is configured to stop an operation of the electronic component mounting apparatus when the component recognition camera detects the electronic component still held by the suction nozzle after the attempt to mount the picked up electronic component on the printed board.

4. The electronic component mounting apparatus of claim 2, wherein the control device controls the suction nozzle so as to discharge the electronic component still held by the suction nozzle after the attempt to mount the picked up electronic component on the printed board when the component recognition camera detects the electronic component still held by the suction nozzle after the attempt to mount the picked up electronic component on the printed board.

5. The electronic component mounting apparatus of claim 4, wherein the electronic component still held by the suction nozzle after the attempt to mount the picked up electronic component on the printed board is discharged into an exhaust box.

6. The electronic component mounting apparatus of claim 4, wherein the control device controls an operation of the electronic component mounting apparatus so as not to use the suction nozzle when the component recognition camera detects the electronic component still held by the suction nozzle after the attempt to mount the picked up electronic component on the printed board.

* * * * *